United States Patent
Ueno et al.

(10) Patent No.: US 9,461,237 B2
(45) Date of Patent: Oct. 4, 2016

(54) POWER GENERATION SWITCH

(71) Applicant: NATIONAL UNIVERSITY CORPORATION KANAZAWA UNIVERSITY, Ishikawa (JP)

(72) Inventors: Toshiyuki Ueno, Ishikawa (JP); Yoshio Ikehata, Ishikawa (JP); Sotoshi Yamada, Ishikawa (JP)

(73) Assignee: National University Corporation Kanazawa University, Ishikawa (JP)

( * ) Notice: Subject to any disclaimer, the term of this patent is extended or adjusted under 35 U.S.C. 154(b) by 540 days.

(21) Appl. No.: 14/079,810

(22) Filed: Nov. 14, 2013

(65) Prior Publication Data

US 2014/0097709 A1 Apr. 10, 2014

Related U.S. Application Data

(63) Continuation of application No. PCT/JP2012/003136, filed on May 14, 2012.

(30) Foreign Application Priority Data

May 16, 2011 (JP) .................. 2011-109928

(51) Int. Cl.
*H01L 41/12* (2006.01)
*H02N 2/18* (2006.01)
*B06B 1/08* (2006.01)

(52) U.S. Cl.
CPC ............. *H01L 41/125* (2013.01); *H01L 41/12* (2013.01); *H02N 2/18* (2013.01); *B06B 1/08* (2013.01)

(58) Field of Classification Search
CPC ........ H01L 41/12; H01L 41/125; B06B 1/08
See application file for complete search history.

(56) References Cited

U.S. PATENT DOCUMENTS 4,443,731 A * 4/1984 Butler .................. B06B 1/06
310/26
4,845,450 A * 7/1989 Porzio .................. B06B 1/0618
310/26

(Continued)

FOREIGN PATENT DOCUMENTS

CN 1880158 12/2006
JP 09-090065 4/1997

(Continued)

OTHER PUBLICATIONS

Chinese Office Action issued Jun. 3, 2015 in corresponding Chinese Patent Application No. 201280023828.8 (with English translation).

(Continued)

*Primary Examiner* — Dang Le
(74) *Attorney, Agent, or Firm* — Wenderoth, Lind & Ponack, L.L.P.

(57) ABSTRACT

A power generation switch includes: parallel beams including at least one magnetostrictive rod made of a beam-shaped magnetostrictive material; a coil wound around the rod; a first connecting part connecting two beams in the parallel beams together, at first ends of the parallel beams; a second connecting part connecting the two beams together at second ends of the parallel beams; a field part that produces magnetic flux to pass through the two beams in the same direction; and an operating part operable by a user. The first connecting part is a non-displaced fixed end. The second connecting part is a free end for free oscillation. The operating part applies external force to the second connecting part to cause free oscillation of the parallel beams, thereby causing a positive axial force in one of the two beams and a negative axial force in the other one of the two beams.

13 Claims, 28 Drawing Sheets

(56) References Cited

U.S. PATENT DOCUMENTS

| | | | | |
|---|---|---|---|---|
| 6,249,064 | B1* | 6/2001 | Bradbury | G11B 5/5552 310/22 |
| 7,563,998 | B2 | 7/2009 | Ueno | |
| 8,766,495 | B2* | 7/2014 | Ueno | H01L 41/125 310/26 |
| 2007/0000343 | A1 | 1/2007 | Ueno | |
| 2010/0133843 | A1 | 6/2010 | Nair | |
| 2013/0140919 | A1* | 6/2013 | Ueno | H01L 41/125 310/26 |
| 2014/0333156 | A1* | 11/2014 | Toyoda | H01L 41/125 310/26 |
| 2014/0346902 | A1* | 11/2014 | Ueno | H01L 41/125 310/26 |
| 2015/0115748 | A1* | 4/2015 | Shimanouchi | H02N 2/186 310/26 |
| 2015/0325778 | A1* | 11/2015 | Furukawa | H02N 2/18 310/26 |

FOREIGN PATENT DOCUMENTS

| | | |
|---|---|---|
| JP | 2005-278226 | 10/2005 |
| JP | 2006-158113 | 6/2006 |
| JP | 2009-130988 | 6/2009 |
| JP | 2009-296734 | 12/2009 |
| JP | 2010-154746 | 7/2010 |

OTHER PUBLICATIONS

International Search Report issued Aug. 14, 2012, in International (PCT) Application No. PCT/JP2012/003136.

EnOcean GmbH, ECO 100, [online], "Motion Converter for Energy Harvesting Wireless Switches", [searched out on Apr. 29, 2011], the Internet <http://www.enocean.com/en/motion-energy-harvesting/>.

* cited by examiner

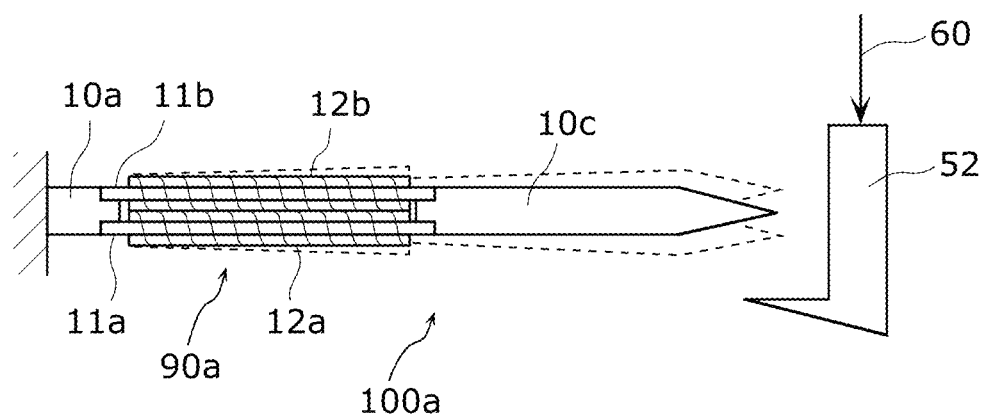

| | Type 1 | | Type 2 | |
|---|---|---|---|---|
| Position | Loc1 | Loc2 | Loc1 | Loc2 |
| $X_0$ [mm] | -0.2 | -0.34 | -0.19 | -0.25 |
| $A_0$ [mm] | 0.26 | 0.54 | 0.28 | 0.40 |
| $V_{max}$ [V] | 0.38 | 0.75 | 1.1 | 1.7 |
| dB [T] | 0.32 | 0.5 | 0.3 | 0.8 |
| $W_0$ [µJ] | 8.2 | 27 | 16.7 | 30 |
| T [ms] | 32 | 32 | 14 | 14 |

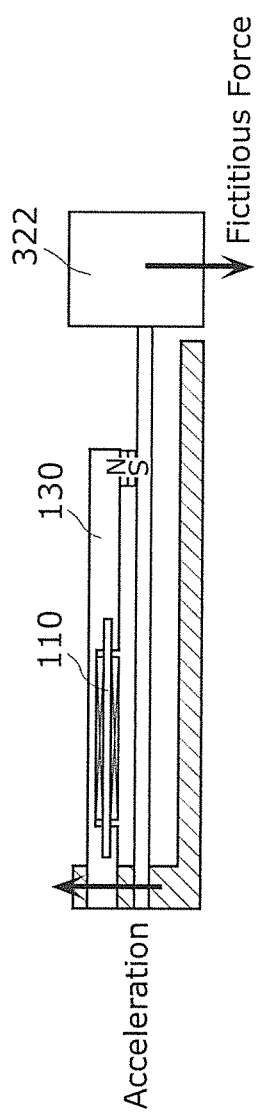

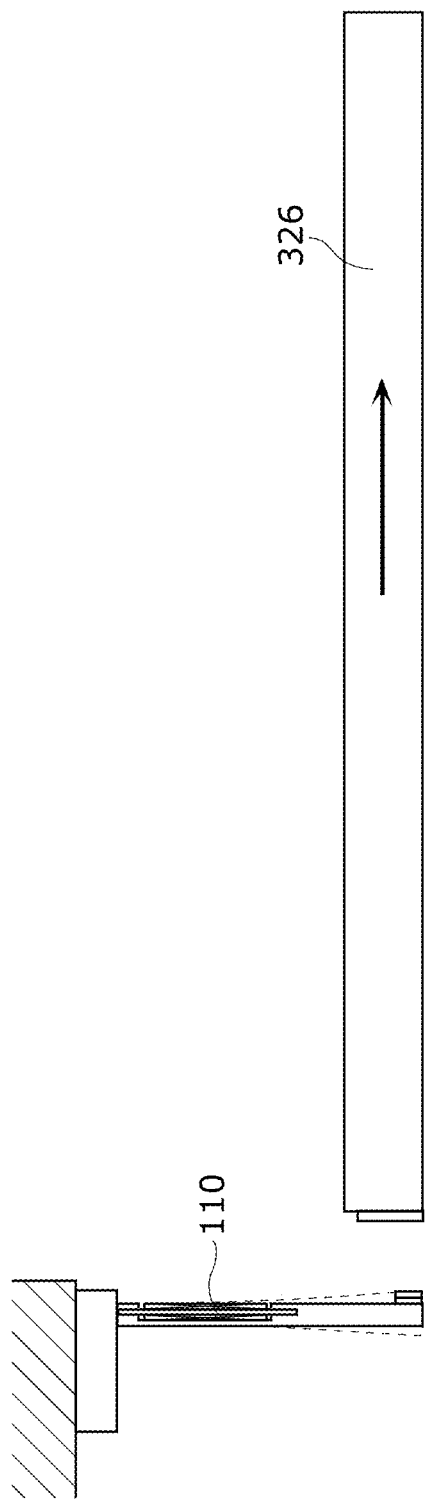

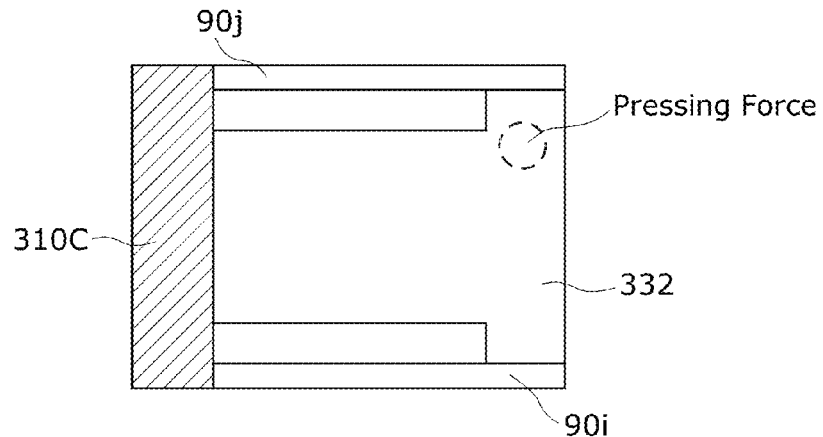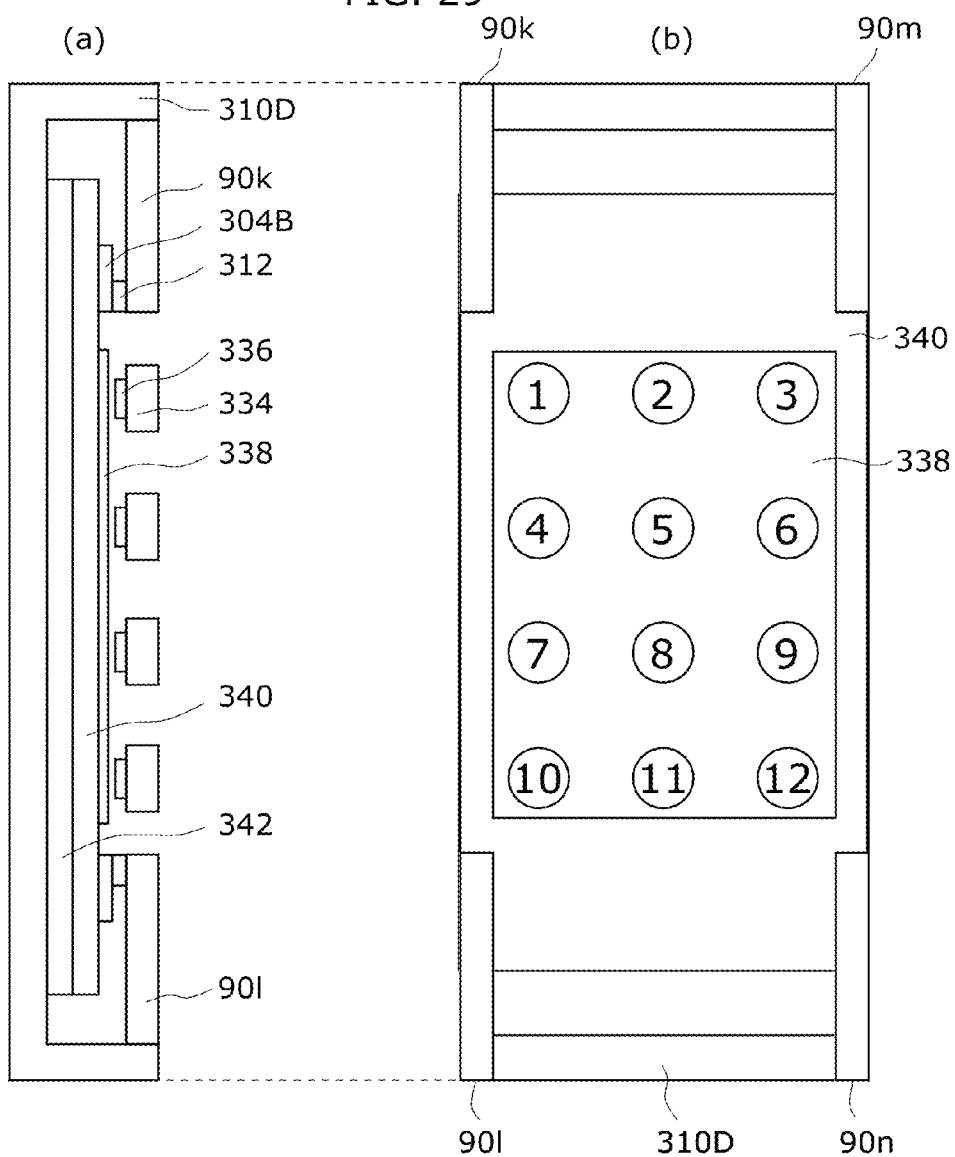

POWER GENERATION SWITCH

CROSS REFERENCE TO RELATED APPLICATIONS

This is a continuation application of PCT Patent Application No. PCT/JP2012/003136 filed on May 14, 2012, designating the United States of America, which is based on and claims priority of Japanese Patent Application No. 2011-109928 filed on May 16, 2011. The entire disclosures of the above-identified applications, including the specifications, drawings and claims are incorporated herein by reference in their entirety.

FIELD

The present invention relates to power generation switches, and more particularly to a power generation switch driven by power produced by inverse magnetostriction effect caused in a magnetostrictive element.

BACKGROUND

There has been a demand for eliminating the use of batteries from remote controllers used for television sets, air conditioners, lighting apparatuses, and the like. The use of batteries have various problems. Dry-cell batteries are consumables and eventually used up. Users therefore bother to set new batteries. In addition, batteries result in industrial wastes with a high disposal cost.

In order to meet the above demand, practical use of a "power generation switch", which is capable of generating power by receiving an action (mechanical action) of pressing a button by a human and transmitting signals generated by the power to a television set, an air conditioner, a lighting apparatus, and the like, has been examined. If such switches can be used practically, remote controllers do not need batteries, for example. In addition, for example, wiring in walls to set up switches in home is not necessary, and therefore the switches can be arranged at any desired places.

Conventionally, as principles of generating power by a linear motion of a human finger, (A) a principle using an electrical magnet and (B) a principle using a piezoelectric material have been known.

For example, Non-Patent Literature 1 is known as the technique using an electrical magnet. A power generation switch disclosed in Non-Patent Literature 1 includes an electrical magnet (combination of a coil, a fixed yoke, a movable yoke, and a magnet) and a projection fitting. A user causes the projection fitting to execute linear motion with respect to the electrical magnet. As a result, the movable yoke becomes movable according to the motion of the projection fitting, and power is generated by temporal changes of interlinkage magnetic flux of the coil according to the motion of the movable yoke.

On the other hand, an example of the technique using a piezoelectric material is disclosed in Patent Literature 1. As shown in FIG. 18, in a power generation switch disclosed in Patent Literature 1, a piezoelectric element 1$a$ having a plate shape is bonded with a leaf spring (supporting plate) 1$b$, and the leaf spring 1$b$ is oscillated to induce an electromotive force in the piezoelectric element 1$a$.

CITATION LIST

Patent Literatures

[Patent Literature 1] Japanese Unexamined Patent Application Publication No. 2006-158113

[Patent Literature 2] Japanese Unexamined Patent Application Publication No. 2010-154746

Non-Patent Literature

[Non-Patent Literature 1] EnOcean GmbH, ECO 100, [online], EnOcean GmbH, [searched out on Apr. 29, 2011], the Internet <http://www.enocean.comien/motion-energy-harvesting/>

SUMMARY

Technical Problem

However, the power generation switch using an electrical magnet which is disclosed in Non-Patent Literature 1 does not produce large power. This is because the power generation switch disclosed in Non-Patent Literature 1 needs to ensure a stroke in free oscillation of the movable yoke to have a length enough for the power generation. Here, a longer stroke in free vibration of the movable yoke results in a lower resonant frequency. However, in order to increase generated power, it is necessary to increase the resonant frequency. Therefore, the power generation switch disclosed n Non-Patent Literature 1 has a difficulty in producing enough power.

Meanwhile the power generation switch disclosed in Patent Literature 1 has the following two problems.

First, since a piezoelectric element is a brittle material, the piezoelectric element has an endurance against a load of repeated bending (tension). Once the piezoelectric element is cracked, power-generation performance is dramatically deteriorated, failing to serve as a power generation switch.

Second, the piezoelectric element is dielectric. More specifically, the piezoelectric element with an electrically induction property has a high output impedance at a low frequency of oscillation (for example, lower than hundreds of hertz). Therefore, a load of a connected low resistance prevents efficient power generation. In order to address the above problem, Patent Literature 2, for example, has been conceived to increase (n times) power by using a plurality of piezoelectric elements (n piezoelectric elements) as a multilayer structure. However, this structure increases a size of a device including the piezoelectric elements, which is not suitable as a power generation switch. Therefore, as disclosed in Patent Literature 1, a mechanism that produces power by causing free oscillation of a piezoelectric element having a bimorph structure has a difficulty in practical use in terms of a durability and producible power.

In order to solve the above-described conventional problems, an object of the present invention is to provide a power generation switch having a high durability and capable of generating more power.

Solution to Problem

In accordance with an aspect of the present invention, there is provided a power generation switch that is driven by power generated by an inverse magnetostriction effect caused in a magnetostrictive element, the power generation switch comprising: parallel beams at least one of which is a magnetostrictive rod made of a magnetostrictive material in a beam shape; a coil wound around the magnetostrictive rod; a first connecting part connecting, at respective first ends of the parallel beams, two beams included in the parallel beams to each other; a second connecting part connecting, at respective second ends of the parallel beams, the two beams included in the parallel beams to each other, the second ends being different from the first ends; a field part that produces magnetic flux to pass through the two beams in a same direction; and an operating part that is operated by a user, wherein the first connecting part is a fixed end that is not displaced, the second connecting part is a free end capable of free oscillation, and the operating part applies an external force to the second connecting part so as to cause free oscillation of the parallel beams, the free oscillation (i) causing a positive axial force in one of the two beams and (ii) causing a negative axial force in an other one of the two beams. It is also possible that the external force is a force caused by one of a wind pressure and a water pressure.

With the above structure, the magnetostrictive rod included in the power generation switch is made of a magnetostrictive element having a ductibility. As a result, the power generation switch has a high durability. In addition, the structure of the power generation switch allows a user to apply an external force to respective free ends of the parallel beams in a direction of causing a bending moment of the parallel beams. As a result, it is possible to oscillate the magnetostrictive element that is a power generation element with a higher resonant frequency, while a force which the user is required to operate the power generation switch is reduced. Therefore, the power generation element can generate more power.

It is possible that the second connecting part is longer than the first connecting part.

The above structure can further reduce the force which the user is required to operate the power generation switch. Furthermore, this structure can increase an amplitude of the free oscillation with the same force in the operation.

It is also possible that at least one of the first connecting part and the second connecting part has an end in a substantially U shape, and the end having the substantially U shape includes a rectangular column part that is pushed to be inserted between the two beams to connect the two beams to each other, the two beams being in contact with inside of the substantially U shape.

With the above structure, the connecting part can more firmly connect the two magnetostrictive rods to each other.

It is further possible that the second connecting part is bent in a substantially U shape.

The above structure can further reduce the force which the user is required to operate the power generation switch, while a whole length of the power generation switch is decreased.

It is still further possible that the first connecting part, the second connecting part, and one of the two beams included in the parallel beams are integrated together.

It is still further possible that one end of the first connecting part is fixed to an inner surface of an opening of a fixed base, and the operating part includes: a lid part covering the opening of the fixed base; and a plate part which is jointed with the lid part and in contact with the second connecting part in the opening of the fixed base, wherein, when the lid part is bent by an external force, the lid part applies the external force to the second connecting part via the plate part so that free oscillation of the parallel beams occurs.

In accordance with another aspect of the present invention, there is provided an operation position detection system comprising a plurality of power generation switches including the above power generation switch wherein the operating parts in the respective power generation switches are integrated into a single switch board, one end of the first connecting part in each of the power generation switches and one end of the single switch board are fixed to a fixed base, one end of the second connecting part in each of the power generation switches sticks to the single switch board via a permanent magnet provided to an other end of the single switch board, and a position operated by the user on the operating part is detected based on a relationship between (a) the position and (b) respective power amounts generated by the power generation switches.

Advantageous Effects

Thus, the present invention can provide a power generation switch capable of having a high durability and producing more power.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 7C is the third diagram showing the structure of the power generation switch according to the variation of Embodiment 1.

FIG. 22C is a diagram showing a structure of a power generation switch according to Variation 2 of Embodiment 6.

FIG. 26B is the second diagram showing the structure of the power generation switch according to the variation of Embodiment 8.

FIG. 28C is the third diagram showing an example of the structure of the operation position detection system according to Embodiment 10.

FIG. 29 is a diagram showing an example of a structure of an operation position detection system according to Embodiment 11.

DESCRIPTION OF EMBODIMENTS

Hereinafter, power generation switches according to embodiments of an aspect of the present invention are described in detail with reference to the drawings.

Embodiment 1

Figure 1:
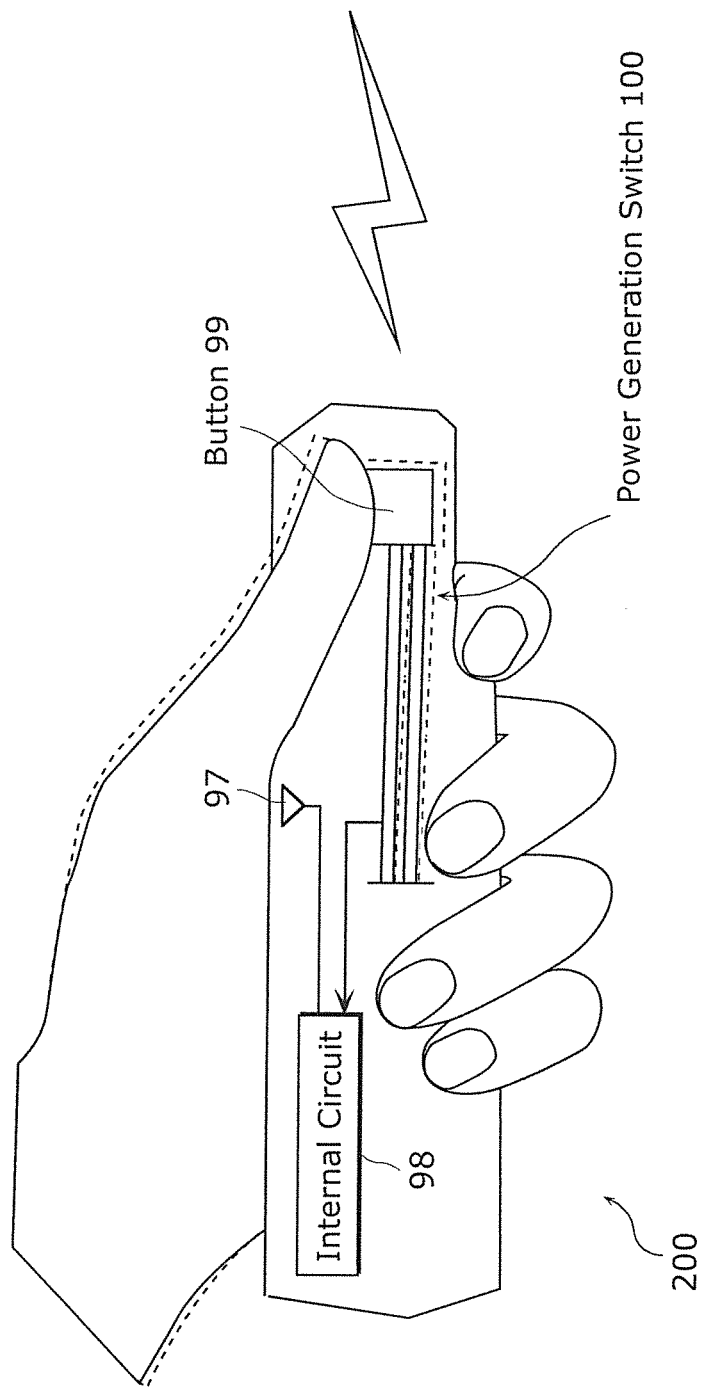
FIG. 1 is a diagram showing an example of a situation using a wireless remote controller that includes a power generation switch according to any one of Embodiments 1 to 3 and their variations.

First, a structure of a power generation switch according to Embodiment 1 is described. FIG. 1 is a diagram showing an example of a situation using a wireless remote controller 200 that includes the power generation switch according to Embodiment 1. As shown in FIG. 1, the wireless remote controller 200 includes a button 99 and a power generation switch 100.

When the user presses the button 99, the power generation switch 100 is subjected to the pressing force, thereby generating power.

The power generation switch 100 is driven by power generated by an inverse magnetostriction effect caused in a magnetostrictive element. The power generated in the power generation switch 100 allows an internal circuit 98 to generate a predetermined wireless signal, and also allows a transmission unit 97 to wirelessly transmit the generated wireless signal. It should be noted that the transmission unit 97 may use radio waves via a wireless Local Area Network (LAN) or according to standard such as Bluetooth®, or may use infrared ray or the like according to a standard of Infrared Data Association (IrDA) or the like.

Figure 2:
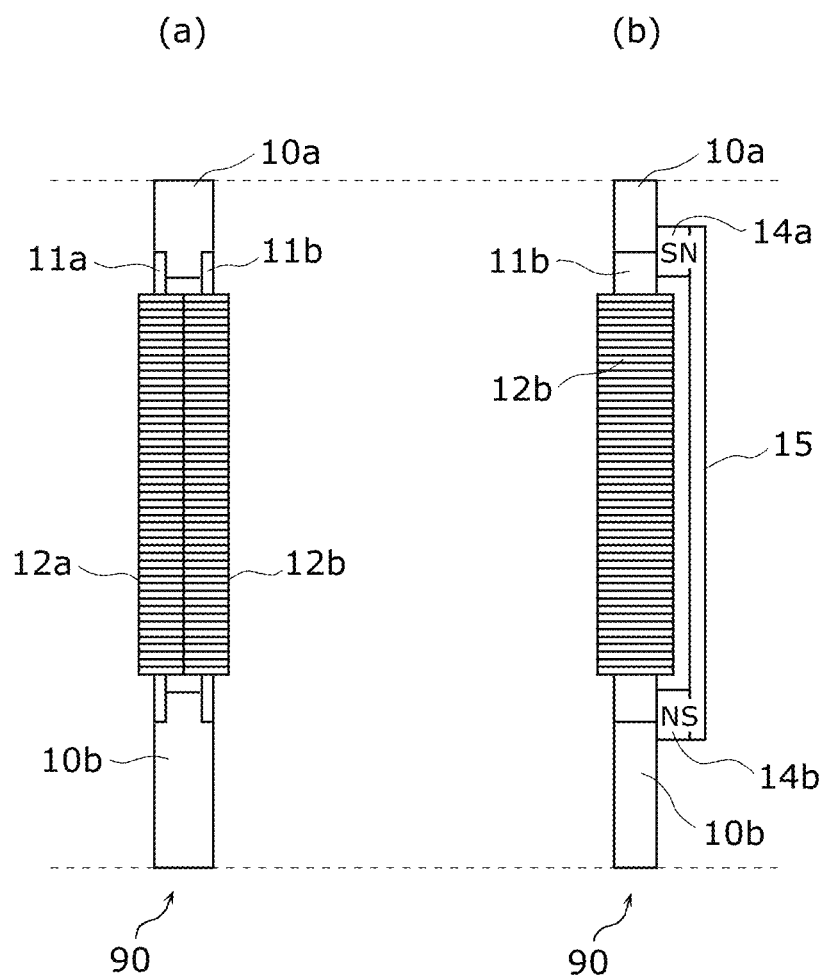
FIG. 2 is a schematic diagram of a power generation element included in the power generation switch according to Embodiment 1.

FIG. 2 is a schematic diagram of a power-generating element 90 included in the power generation switch 100 according to the present embodiment. In FIG. 2, (*a*) is a plane view and (*b*) is a side view.

As shown in (a) and (b) in FIG. 2, the power generation element 90 includes connecting parts 10*a* and 10*b*, magnetostrictive rods 11*a* and 11*b*, coils 12*a* and 12*b*, field parts 14*a* and 14*b*, and a back yoke 15.

Each of the magnetostrictive rods 11*a* and 11*b* is a magnetostrictive material in the shape of a column. As shown in (a) in FIG. 2, the magnetostrictive rods 11*a* and 11*b* are arranged in parallel to each other to form parallel beams.

The coil 12*a* is wound around the magnetostrictive rod 11*a*. The coil 12*b* is wound around the magnetostrictive rod 11*b*.

The field parts 14*a* and 14*b* cause magnetic flux to pass through each of the two magnetostrictive rods 11*a* and 11*b* in the same direction. The field parts 14*a* and 14*b* are, for example, permanent magnets or electrical magnets.

The connecting part 10*a* is a rod-shaped part that firmly connects the magnetostrictive rods 11*a* and 11*b* to each other at respective first ends of the parallel beams consisting of the two magnetostrictive rods. Hereinafter, the connecting part 10*a* is referred to also as a first connecting part.

The connecting part 10*b* is a rod-shaped part that firmly connects the magnetostrictive rods 11*a* and 11*b* to each other at respective second ends of the parallel beams consisting of the two magnetostrictive rods. The second end is different from the first end, and located at the opposite side of the parallel beams to face the first end. Hereinafter, the connecting part 10*b* is referred to also as a second connecting part. It should be noted that the connecting part 10*b* is desirably longer than the connecting part 10*a* in an axis direction for the reasons described later.

The back yoke 15 is a structure for producing a bias magnetic field in the magnetostrictive rods 11*a* and 11*b*. The details are described later.

Figure 3:
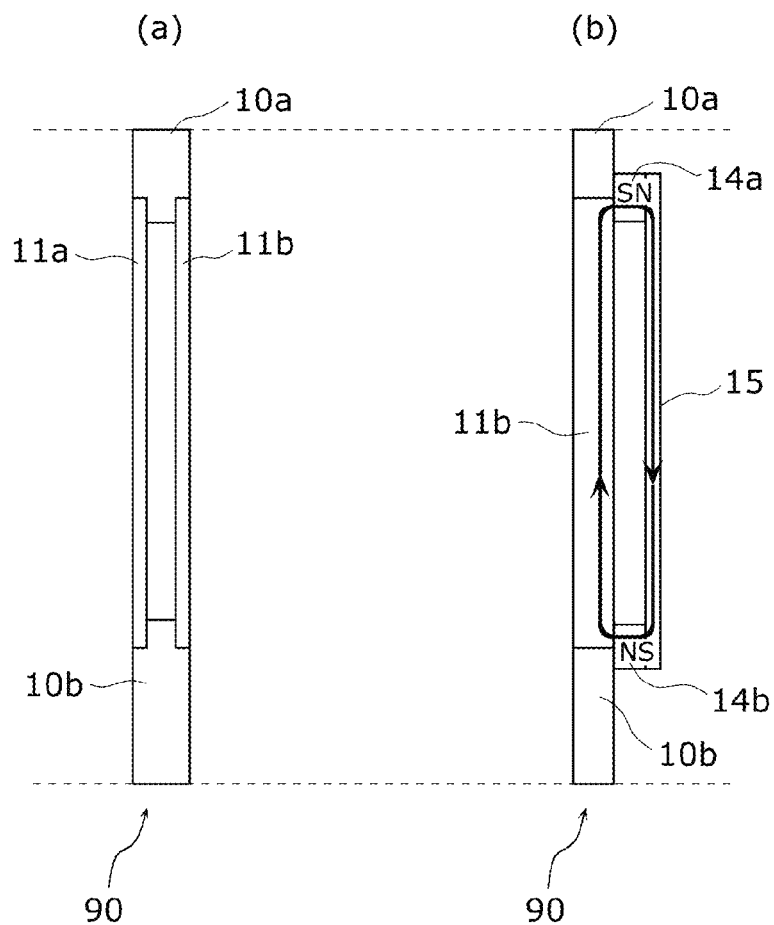
FIG. 3 is a schematic diagram showing arrangement positions of magnetostrictive rods and connecting parts of the power generation element shown in FIG. 2.

FIG. 3 is a schematic diagram showing arrangement positions of the magnetostrictive rods 11*a* and 11*b* and the connecting parts 10*a* and 10*b* of the power generation element shown in FIG. 2. (a) in FIG. 3 corresponds to (a) in FIG. 2, and (b) in FIG. 3 corresponds to (b) in FIG. 2.

The magnetostrictive rods 11*a* and 11*b* are made of, for example, galfenol that is an alloy of iron and gallium. Each of the magnetostrictive rods 11*a* and 11*b* has a ductibility and has the shape of, for example, a cuboid rod with dimensions of 1 mm×0.5 mm×10 mm. As shown in (a) and (b) in FIG. 3, the magnetostrictive rods 11*a* and 11*b* are arranged in parallel to each other. The magnetostrictive rods 11*a* and 11*b* have an end provided with the connecting part 10*a* that magnetically connects the magnetostrictive rods 11*a* and 11*b* together to be mechanically and firmly jointed. The magnetostrictive rods 11*a* and 11*b* have the other end provided with the connecting part 10*b* that also magnetically connects the magnetostrictive rods 11*a* and 11*b* together to be mechanically and firmly jointed. The connecting parts 10*a* and 10*b* are made of a magnetic material including, for example, iron (Fe). The connecting parts 10*a* and 10*b* are mechanically and magnetically connected to the magnetostrictive rods 11*a* and 11*b* to connect the magnetostrictive rods 11*a* and 11*b* to each other. In other words, the connecting parts 10*a* and 10*b* serve as so-called yokes.

It should be noted that the connecting parts 10*a* and 10*b* are not necessarily made only of a magnetic material. For example, it is also possible that a magnetic material is jointed in a longitudinal direction to a non-magnetic material that is provided to extend a length of the magnetic material, as long as at least the magnetic material magnetically connects the magnetostrictive rods 11*a* and 11*b* together.

It is also desirable that the connecting parts 10*a* and 10*b* have a sufficient rigidity. More specifically, if the connecting parts 10*a* and 10*b* are made of an iron material (such as a common ferrous material or a magnetic stainless steel), the connecting parts 10*a* and 10*b* desirably have a longitudinal elasticity modulus ranging approximately from 190 GPa to 210 GPa. As described later, the magnetostrictive rods 11*a* and 11*b* need to be firmly jointed to the connecting parts 10*a* and 10*b* having such a sufficient rigidity.

Furthermore, as shown in (b) in FIG. 3, the back yoke 15 is provided at the bottom side of the power generation element 90.

As shown in (b) in FIG. 3, the back yoke 15 has the field part 14*a* closer to the connecting part 10*a* and the field part 14*b* closer to the connecting part 10*b*. The back yoke 15 is connected to the connecting parts 10*a* and 10*b* via the field parts 14*a* and 14*b*, respectively.

The field part 14*a* has a north pole at the side connected to the back yoke 15, and a south pole at the side connected to the connecting part 10*a*. The field part 14*b* has a south pole at the side connected to the back yoke 15, and a north pole at the side connected to the connecting part 10*b*. The connecting parts 10*a* and 10*b*, the magnetostrictive rods 11*a* and 11*b*, the field parts 14*a* and 14*b*, and the back yoke 15 form a magnetic loop as shown by an arrow in (b) in FIG. 3. With the structure, a magnetomotive force of the field parts 14*a* and 14*b* causes a bias magnetic field in the magnetostrictive rods 11*a* and 11*b*. In other words, a magnetization direction in the magnetostrictive rods 11*a* and 11*b* is set to be parallel to an axis direction of the magnetostrictive rods 11*a* and 11*b*. A magnitude of the magnetization in the above case is, for example, 0.85 T (tesla) that is a half of a saturation magnetic flux density.

Moreover, as shown in (a) and (b) in FIG. 2, the magnetostrictive rod 11*a* has the coil 12*a*, and the magnetostrictive rod 11*b* has the coil 12*b*. Each of the coils 12*a* and 12*b* is made of, for example, a copper wire, and has the number of turns of 250. According to the number of turns of each of the coils 12*a* and 12*b*, it is possible to adjust a magnitude of a voltage caused in the power generation element. A resin fills a space between the coils 12*a* and 12*b* to integrate the coils 12*a* and 12*b* together. However, the structure is not limited to the above and the coils 12*a* and 12*b* may not be integrated together. The number of turns may be the same for both the coils, or different between the coils.

Figure 4:
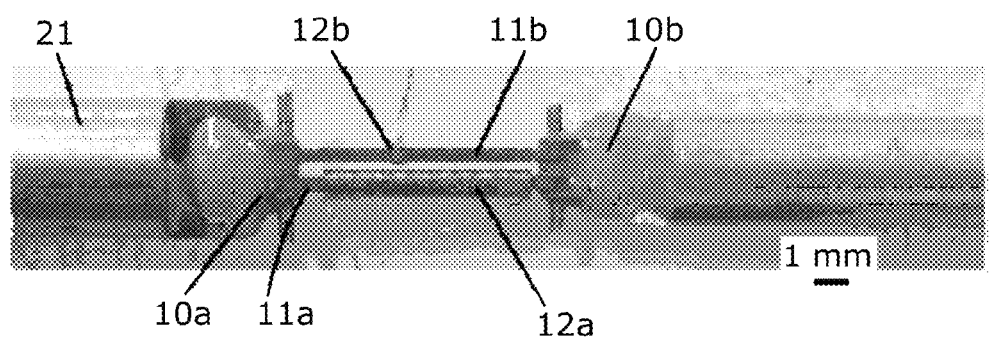
FIG. 4 is a photograph showing an application example of the power generation element shown in FIG. 2.

FIG. 4 is a photograph showing an example of the power generation element 90. Each of the magnetostrictive rods 11*a* and 11*b* is, for example, a cuboid (rectangular column) rod in shape with a cross-sectional surface of 1 mm×0.5 mm and a length in an axis direction of approximately 10 mm. The connecting part 10*a* is fixed to the fixing part 21.

Figure 5A:
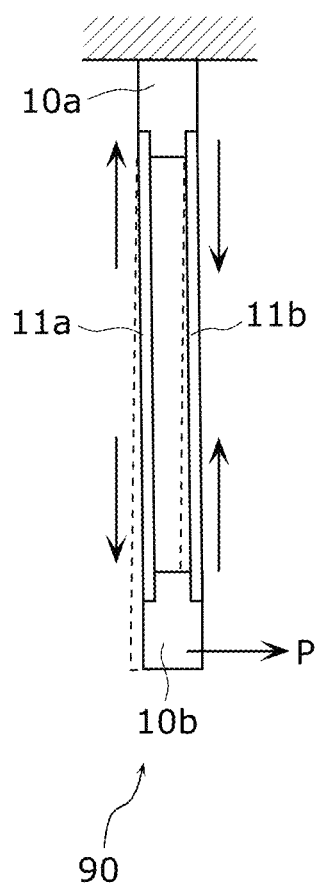
FIG. 5A is the first diagram for explaining a mechanism of power generation by the power generation element shown in FIG. 2.
Figure 5B:
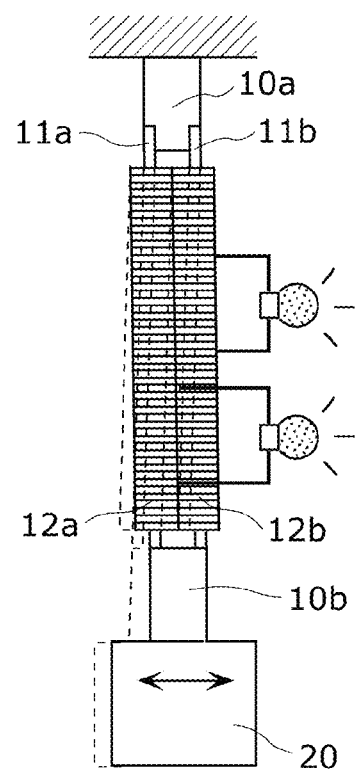
FIG. 5B is the second diagram for explaining the mechanism of the power generation by the power generation element shown in FIG. 2.

Each of FIGS. 5A and 5B is a diagram for explaining a mechanism of power generation of the power generation element 90 included in the power generation switch 100 according to the present embodiment. More specifically, FIG. 5A is a diagram showing an operation of the magnetostrictive rods 11*a* and 11*b*. FIG. 5B is a diagram showing the state where the coils 12a and 12b and a weight 20 are provided to the magnetostrictive rods 11a and 11b.

The principle of power generation of the power generation element 90 uses an inverse magnetostriction effect of a magnetostrictive material. Here, the inverse magnetostriction effect is an effect of changing magnetic flux by applying a stress to a magnetized magnetostrictive material. If a temporal change occurs in the magnetic flux, an induction voltage is produced in the coil according to Faraday's law of electromagnetic induction.

Since the magnetostrictive rods 11a and 11b form a parallel-beam structure, a small bending force can cause a large stress change in the magnetostrictive rods 11a and 11b. More specifically, in comparison to the case where the magnetostrictive rods are contracted or extended in a longitudinal direction of the magnetostrictive rods, almost one tenth of the above force can produce the same magnitude of the stress change in the magnetostrictive rods. Moreover, in the two magnetostrictive rods 11a and 11b which are connected via the connecting parts, axial forces occur in opposite directions, so that changes in the magnetic flux are also opposite between the two magnetostrictive rods. As a result, polarities (positive/negative) of the induction voltage occurred in the magnetostrictive rods 11a and 11b are opposite between the magnetostrictive rods. The power generation element can therefore generate power without cancelling the inverse magnetostriction effects of the magnetostrictive rods 11a and 11b. Therefore, when the user presses the button 99 of the power generation switch 100 with a small force, the inverse magnetostriction effect causes a large temporal change in the magnetic flux in the magnetostrictive rods 11a and 11b. As a result, the power generation element 90 can efficiently generate power. Furthermore, in general, coils are electrically inductive loads. Therefore, inductive components can be ignored in the case where a frequency of oscillation of the power generation element 90 is equal to or lower than a bending resonant frequency of the parallel beams (up to hundreds of hertz). An output impedance of the power generation element 90 is only the resistance of the coils, which is merely in a range from several of Ω to several dozens of Ω. Therefore, even if the power generation element 90 is connected to a load of a low impedance resistance, such as an internal circuit of the wireless remote controller 200, the generated power can be efficiently supplied to the load.

The magnetostrictive material of the magnetostrictive rods 11a and 11b is desirably, for example, an alloy of iron and gallium which produces an sufficient inverse magnetostriction effect and has a good mechanical workability and a high tolerability against being bent and pulled. However, the magnetostrictive material is not limited to an alloy of iron and gallium and may be any magnetostrictive material as long as it has the above-described properties.

More specifically, as shown in FIG. 5A, when the connecting part 10a in the power generation element 90 is fixed to a fixing part and the connecting part 10a in the power generation element 90 is applied with a predetermined bending force P, the connecting part 10b oscillates like a pendulum. Here, a direction of the bending force P is perpendicular to the axis direction of the magnetostrictive rods 11a and 11b. The pendulum-like oscillation of the connecting part 10b causes resonance of the power generation element 90. In the above case, a resonant frequency is, for example, hundreds of hertz but may be in a range from dozens of hertz to 1 kHz.

When the connecting part 10b is applied with the bending force P, the magnetostrictive rods 11a and 11b are bent and deformed. More specifically, if the power generation element 90 is applied with the bending force P in a direction shown in FIG. 5A, the magnetostrictive rod 11a is extended and the magnetostrictive rod 11b is contracted. On the other hand, if the connecting part 10b is applied with a bending force in a direction opposite to the direction of the above bending force P, the magnetostrictive rod 11a is contracted and the magnetostrictive rod 11b is extended. As described above, according to inverse magnetostriction effects, the extension and contraction of the magnetostrictive rods 11a and 11b increase or decrease the magnetic flux which are caused in the magnetostrictive rods 11a and 11b by the field parts 14a and 14b. More specifically, a density of the magnetic flux passing through each of the coils 12a and 12b is changed. As shown in FIG. 5B, the temporal change of the magnetic flux density causes an induction voltage (or an induction current) in the coils 12a and 12b.

Next, a structure of the power generation switch 100 including the above-described power generation element 90 is described.

Prior to the description for the structure, the following describes consideration of requirements for the power generation switch 100 including the power generation element 90 that is made of a magnetostrictive material as a switch power source.

A voltage generated by the power generation element 90 is increased in proportion to an oscillation frequency of the magnetostrictive rods 11a and 11b. Therefore, for efficient power generation of the power generation element 90, it is desirable to oscillate the power generation element 90 at a resonant frequency of the parallel beams consisting of the magnetostrictive rods 11a and 11b. Here, the power generation element 90 oscillates at a resonant frequency when free oscillation occurs. Therefore, the power generation switch 100 needs to have a structure allowing a user's operation to cause free oscillation of the parallel beams in the power generation element 90.

More specifically, free oscillation is occurred by applying a transitional force change to the parallel beams. An example is an action of picking the beam. A picking action is caused when, for example, a structure having a projection is connected to the end of the set of the parallel beams and the projection is pressed by an operating part applied with an external force by the user, so as to bend the parallel beams. When the bending of the parallel beams exceeds a certain value, the operating part instantaneously comes off from the projection to cause free oscillation of the parallel beams. Another example is the use of a magnet. The ends of the parallel beams are made of a magnetic material, while an operating part subjected to a pressing force is provided with a magnet. When the magnet of the operating part sticks to the ends of the parallel beams, an external force is applied to the operating part. As a result, the operating part is displaced while the magnet is kept sticking to the ends of the parallel beams. Then, the external force is kept being applied and the bending of the parallel beams exceeds a certain value, the ends of the parallel beams come off from the magnet. Therefore, the force applied to the parallel beams transiently becomes zero, and thereby free oscillation occurs. The above-described picking action or the above-described action of causing the sticking force of the magnet to be zero occurs free oscillation of the parallel beams. As a result, the power generation element 90 can efficiently generate a voltage.

Furthermore, the parallel beams are two beams (namely, the magnetostrictive rods 11a and 11b) which are arranged separate from each other, so that the parallel beams have a high rigidity against being bent. Here, in order to increase a generated power amount or a generated voltage, it is necessary to increase a resonant frequency. In order to increase the resonant frequency, it is efficient to increase an interval between the beams (rods) or increase a volume of the beams.

However, if the interval between the beams (rods) is increased or the volume of the beams is increased, the rigidity of the parallel beams against being bent may be increased too high to deform the parallel beams. The power generation switch 100 is operated by a human finger. It is therefore necessary to consider an appropriate pressing force and an appropriate pressing amount (displacement). In order to efficiently bend the parallel beams and to match a mechanical impedance applied with a human pressing action, it is necessary to determine an appropriate length of the structure provided to the beam and determine a shape of the structure according to modes of switching operations.

In general, if a longer structure is applied with a force at its end, a greater moment of bending the parallel beams (bending moment) is obtained. In other words, since a bending moment is calculated as the product of a distance of a force "distance×force", a longer distance allows a smaller force to produce the same bending moment. However, in this case, a distance for applying the force is also increased. Therefore, it is necessary to appropriately determine the shape of the power generation element 90 in consideration with a pressing force or a displacement caused by switching. Moreover, it is also possible to determine the shape of the power generation element 90 according to modes of switching operations (for example, sliding, perpendicularly pressing, or rotating).

Next, the description is given for the structure of the power generation switch 100 according to the present embodiment in consideration of the above-described requirements.

Figure 6A:
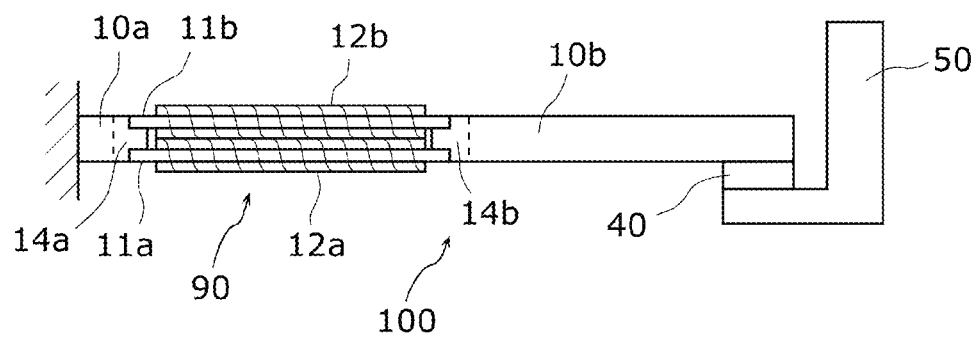
FIG. 6A is the first diagram showing a structure of the power generation switch according to Embodiment 1.
Figure 6B:
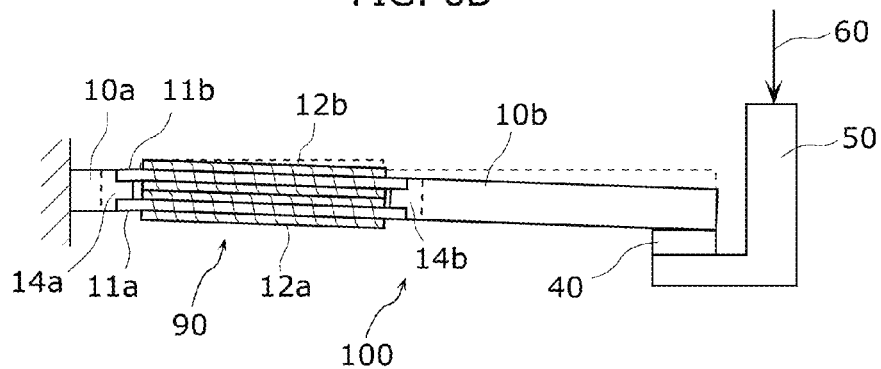
FIG. 6B is the second diagram showing the structure of the power generation switch according to Embodiment 1.
Figure 6C:
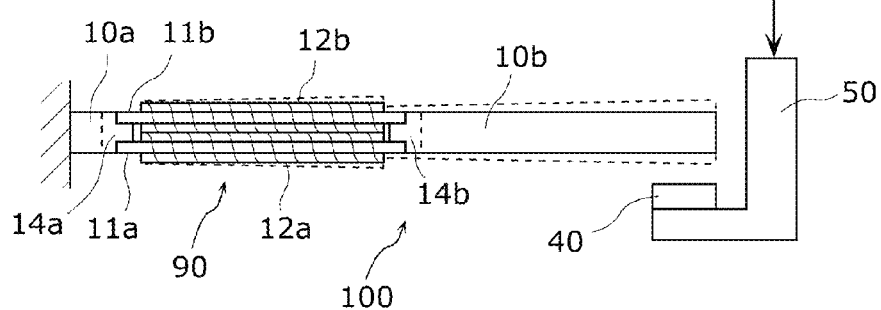
FIG. 6C is the third diagram showing the structure of the power generation switch according to Embodiment 1.

FIGS. 6A to 6C are diagram showing the structure of the power generation switch 100 according to the present embodiment. In more detail, FIG. 6A shows the power generation switch 100 at an initial state where a displacement amount of the operating part 50 is zero.

As shown in FIG. 6A, the power generation switch 100 includes the power generation element 90 and the operating part 50. The operating part 50 is a user interface used by the user to operate the power generation switch 100. When the user presses the operating part 50, the operating part 50 applies the external force in a perpendicular downward direction to the connecting part 10b that is the first connecting part. The operating part 50 according to the present embodiment has a permanent magnet 40. The permanent magnet 40 causes the operating part 50 to stick to the connecting part 10b.

As shown in FIG. 6A, in the present embodiment, the connecting part 10a that is the first connecting part is fixed to a wall surface or the like. In other words, the connecting part 10a serves as a fixed end that is not displaced.

On the other hand, FIG. 6B shows the power generation switch 100 in the state where an external force 60 caused by a user's operation displaces the operating part 50.

The operating part 50 applies the external force to the connecting part 10b that is the second connecting part, so that a positive axial force occurs in one of the magnetostrictive rods 11a and 11b and free oscillation occurs in the other one of the magnetostrictive rods 11a and 11b to produce a negative axial force. In other words, the connecting part 10a is fixed to a direction allowing the operating part 50 to apply an external force to the connecting part 10b so as to bend the surfaces of the parallel beams which include the surfaces of the magnetostrictive rods 11a and 11b.

More specifically, when the user applies the external force 60 to the operating part 50, the operating part 50 displaces the right end of the connecting part 10b to a perpendicular downward direction while the permanent magnet 40 is kept sticking to the right end. As a result, an axial force in a pulling direction (namely, a positive axial force) occurs in the magnetostrictive rod 11b that is an upper beam included in the parallel beams. On the other hand, an axial force in a contracting direction (namely, a negative axial force) occurs in the magnetostrictive rod 11a that is a lower beam included in the parallel beams.

If the operating part 50 is kept being displaced downwards and a reaction force occurred in the parallel beams exceeds the sticking force of the permanent magnet 40, the power generation element 90 and the connecting part 10b start free oscillation.

FIG. 6C shows the power generation switch 100 in the free oscillation. As shown in FIG. 6C, the connecting part 10b that is the second connecting part is a free end capable of free oscillation. The connecting part 10b freely oscillates together with the power generation element 90 connected to the connecting part 10b. As a result, a induction voltage is produced in the power generation element 90.

It should be noted that, as described earlier, the connecting part 10b is desirably longer than the connecting part 10a. More specifically, it is desirable that the connecting part 10a is as short as possible and the connecting part 10b is as long as possible. This is because it is efficient to increase a resonant frequency of the parallel beams in order to enhance the power generation performance, and it is efficient to improve a rigidity of the parallel-beam structure to enhance the power generation performance. However, a too high rigidity prevents the user from pressing the switch. Here, the longer connecting part 10b allows the user to use a smaller power to press the power generation switch 100 according to the principle of leverage. In other words, the longer connecting part 10b results in a higher rigidity of the parallel-beam structure within a user's operable force. On the other hand, since the connecting part 10a is the fixed end, the shorter connecting part 10a results in the shorter whole length of the power generation switch 100.

It should be noted that it has been described in the present embodiment that the operating part 50 uses a sticking force of the magnet to apply an external force to the connecting part 10b to cause a bending moment, but the structure allowing the operating part 50 to apply an external force to the connecting part 10b is not limited to the above.

Figure 7A:
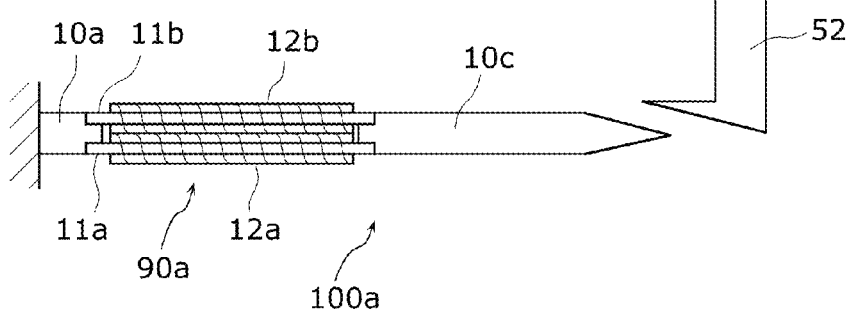
FIG. 7A is the first diagram showing a structure of a power generation switch according to a variation of Embodiment 1.
Figure 7B:
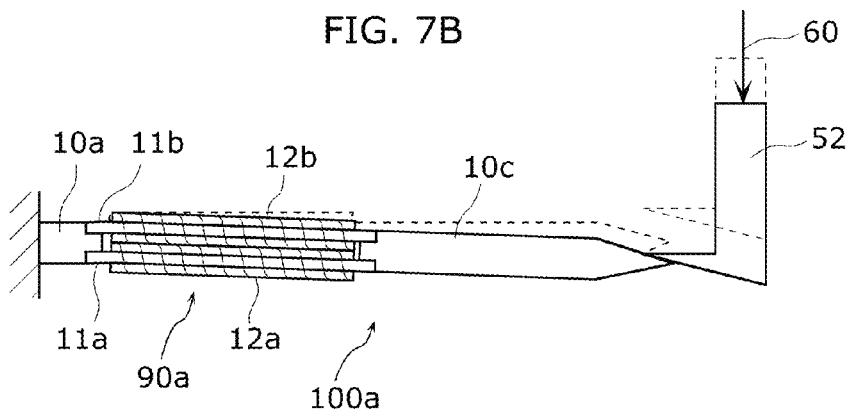
FIG. 7B is the second diagram showing the structure of the power generation switch according to the variation of Embodiment 1.

For example, FIGS. 7A to 7C are diagrams showing a structure of a power generation switch according to a variation of Embodiment 1.

In the present variation, a physical nail structure is used instead of the permanent magnet 40. More specifically, as shown in FIGS. 7A to 7C, the power generation switch 100a according to the present variation includes a power generation element 90a and an operating part 52. It should be noted that the same reference numerals in FIGS. 6A to 6C are assigned to the identical structural elements in FIGS. 7A to 7C, so that the identical structural elements are not described again below.

The power generation element 90a differs from the power generation element 90 in that the connecting part 10b is replaced by a connecting part 10c.

The connecting part 10c has a sharp end to be in contact with the operating part 52. Likewise, the connecting part 52c also has a sharp end to be in contact with the connecting part 10c.

Such ends of the connecting part 10c and the operating part 52 cause the operating part 52 and the connecting part 10c to be less likely to in contact with each other. This structure makes it possible to adjust a maximum value of a bending moment applied by the operating part 52 to the connecting part 10c.

Next, results of an evaluation experiment of the power generation switch 100 performed by the inventors are described with reference to FIGS. 8 and 9.

In the evaluation experiment, two kinds of the power generation element 90 (type 1 and type 2) are manufactured as prototypes, and properties of the prototypes are compared. In both the types, the magnetostrictive rods 11a and 11b have the same shape and dimensions of 0.5 mm×1 mm×12 mm. However, the type 1 has an interval of 0.5 mm between the magnetostrictive rods 11a and 11b, while the type 2 has an interval of 1 mm between the magnetostrictive rods 11a and 11b. Therefore, the number of turns N of a coil in the type 2 is greater than that of the type 1.

Here, the number of turns N of the type 1 is 419, and the number of turns N of the type 2 is 964. A resistance $R_0$ of the coil of the type 1 is 15Ω, and a resistance $R_0$ of the coil of the type 2 is 38Ω. Therefore, in comparison to the type 1, the type 2 has a higher bending rigidity and a higher primary bending resonant frequency, with the increase of a moment of inertia of area.

Figure 8:
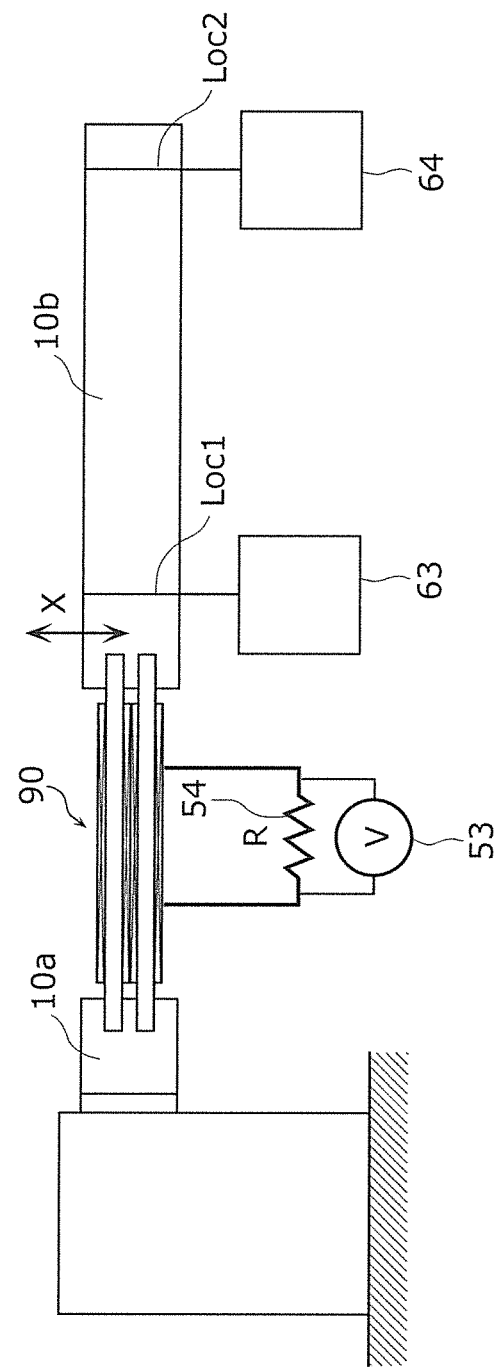
FIG. 8 is a diagram for explaining an experiment for examining performance of the power generation switch according to any one of Embodiments 1 to 3 and their variations.

FIG. 8 is a diagram for explaining an experiment for examining performance of the power generation switch 100 according to Embodiment 1. It should be noted that, in the experiment, a weight is used instead of the operating part 50 to see how a difference in a length of the connecting part 10b influences power generation.

More specifically, a weight of 200 g is hung by a string from the connecting part 10b, and the string is cut to occur free oscillation of the connecting part 10b. A position from which the weight is hung is one of (a) Loc1 that is a position closer to the power generation element 90 in the connecting part 10b, and (b) Loc2 that is farther to the power generation element 90 in the connecting part 10b. A weight hung from Loc1 is referred to as a weight 63, and a weight hung from Loc2 is referred to as a weight 64.

A displacement X of the connecting part 10b is measured by measuring the center part of the connecting part 10b by a laser displacement meter. According to matching conditions for obtaining maximum power, the power generation element 90 as the type 1 is provided with a resistance load R54 of 30Ω, and the power generation element 90 as the type 2 is provided with a resistance load R54 of 76Ω. A probe with an internal impedance of 1 MΩ detects a voltage V53 between the ends of the resistance load R54.

Figures 9, 10A:
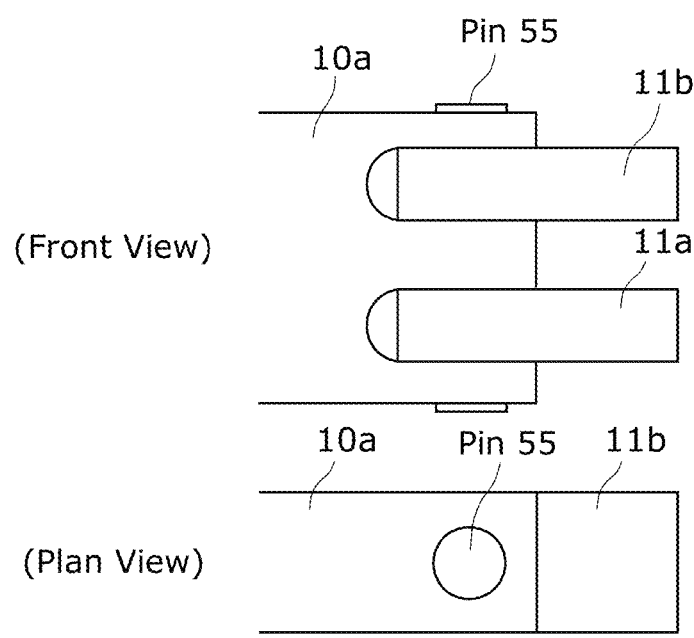
FIG. 9 is a diagram showing experiment results of examining performance of the power generation switch according to any one of Embodiments 1 to 3 and their variations.
FIG. 10A is a diagram showing an example of methods of fixing magnetostrictive rods in the power generation switch according to any one of Embodiments 1 to 3 and their variations.

FIG. 9 shows results of the experiment. In FIG. 9, $X_0$ represents an initial displacement of the connecting part 10b, $A_0$ represents an initial amplitude, $V_{max}$ represents a maximum value of a generated voltage, dB represents a change width of a magnetic flux density, $W_0$ represents electrical energy, and T represents an oscillation time duration.

When the type 1 and the type 2 are compared to each other at Loc1, the type 2 has $W_0$ that is approximately twice as much as $W_0$ of the type 1. However, when the type 1 and the type 2 are compared to each other at Loc2, there is no significant difference of $W_0$ between the type 1 and the type 2. This is probably because the change from Loc1 to Loc2 increases an initial amplification $A_0$ of the type 2 to 1.4 times (=0.40/0.28 mm), which is shorter than 2.1 times in the case of the type 1. In other words, it is supposed that the type 2 has a high bending rigidity of the parallel beams, which makes it difficult to deform the parallel beams even with the increase of the bending moment.

From the above results, it is expected that, if the magnetostrictive rods are in the same shape, power generation amount can be increased by increasing an interval between the magnetostrictive rods 11a and 11b to increase a bending rigidity and the number of turns of a coil. Actually, in the case of Loc 2 for the type 2, a maximum instantaneous power is 32 mW, and an average generation power ($W_0$/T) is 2.1 mW.

The above experimental results prove that a power generation amount is increased when the connecting part 10b is longer than the connecting part 10a.

In the meanwhile, when the experiment is kept being performed, the connecting part 10a comes off from the magnetostrictive rods 11a and 11b. Therefore, in the power generation switch 100, it is practically important to firmly joint the connecting part 10a to the magnetostrictive rods 11a and 11b.

Figure 10B:
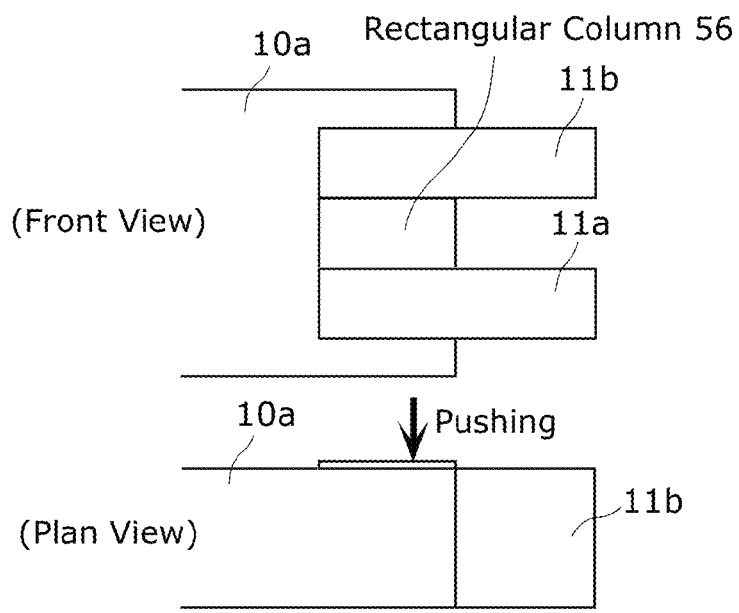
FIG. 10B is a diagram showing another example of methods of fixing the magnetostrictive rods in the power generation switch according to any one of Embodiments 1 to 3 and their variations.

FIGS. 10A and 10B are diagrams showing methods of fixing the magnetostrictive rods 11a and 11b in the power generation switch 100 according to the present embodiment. FIGS. 10A and 10B show different examples of the fixing methods. The fixing method in FIG. 10B is more desirable than that in FIG. 10A. The following explains it in detail.

FIG. 10A shows a method of inserting the magnetostrictive rods 11a and 11b into respective grooves in the connecting part 10a, and fixing the magnetostrictive rods 11a and 11b by a pin 55 that penetrates the magnetostrictive rods. An epoxy adhesive is impregnated to and around a gap between the grooves and the magnetostrictive rods to fix the magnetostrictive rods to fasten them. However, the experiment of the inventors shows that the magnetostrictive rods sometimes come off even in the fixing method in FIG. 10A.

FIG. 10B shows a better fixing method.

In FIG. 10B, the first connecting part 10a has an end in a substantially U shape with all corners in straight angles. A rectangular column part 56 is provided inside the substantially U-shaped end. More specifically, the rectangular column part 56 is pushed in the substantially U shape to be inserted between one end of the magnetostrictive rod 11a and one end of the magnetostrictive rod 11b to connect the two magnetostrictive rods to each other. Here, the ends of the two magnetostrictive rods are in contact with the inside of the substantially U shape of the first connecting part 10a. If the connecting part is coated by an adhesive or the like, the firmness of the connection is more enhanced.

It should be noted that, with reference to FIGS. 10A and 10B, the description has been given for the case where the connecting part 10a connects the magnetostrictive rods 11a and 11b together, but the same goes for the case where the connecting part 10b connects the magnetostrictive rods 11a and 11b together.

It should also be noted that, if the parallel beams are two beams which are (a) a single magnetostrictive rod and (b) a beam made of a material different from a material of the magnetostrictive rod, it is possible that, at the substantially U-shaped end, a rectangular column part is pushed in the substantially U shape to be inserted between ends of the two beams to connect them together. Here, the ends of the two beams are in contact with the inside of the substantially U shape.

Embodiment 2

In Embodiment 1 and its variation above, the description has been given for the power generation switch operated by a user's action of pressing the operating part in a perpendicular downward direction.

Figure 11A:
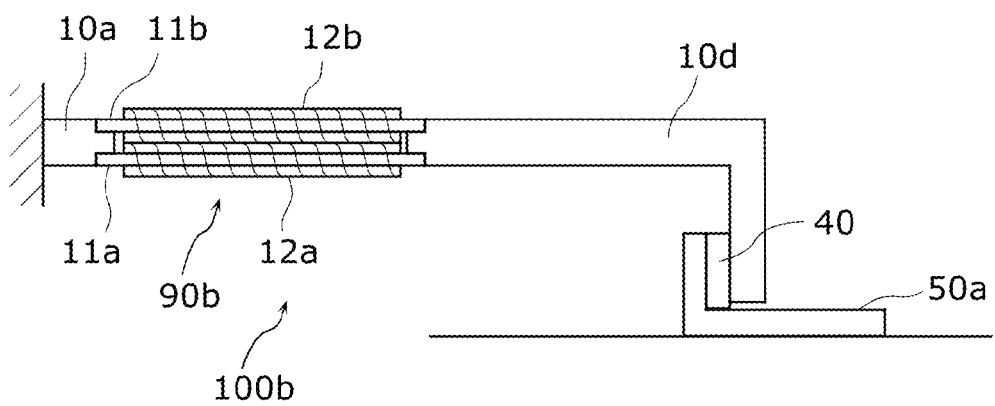
FIG. 11A is the first diagram showing a structure of a power generation switch according to Embodiment 2.
Figure 11B:
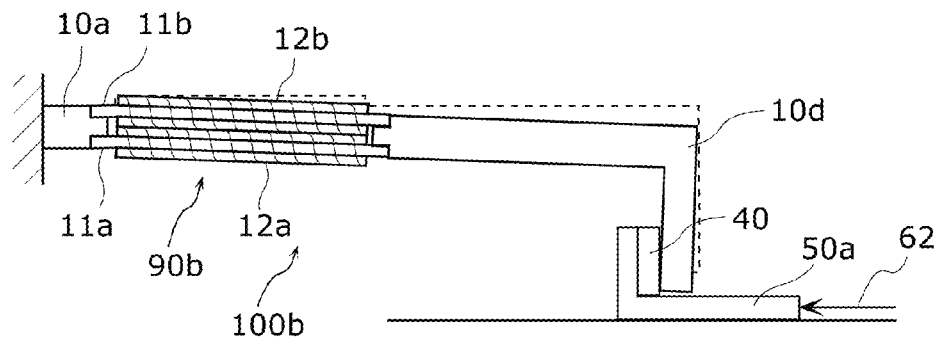
FIG. 11B is the second diagram showing a structure of the power generation switch according to Embodiment 2.
Figure 11C:
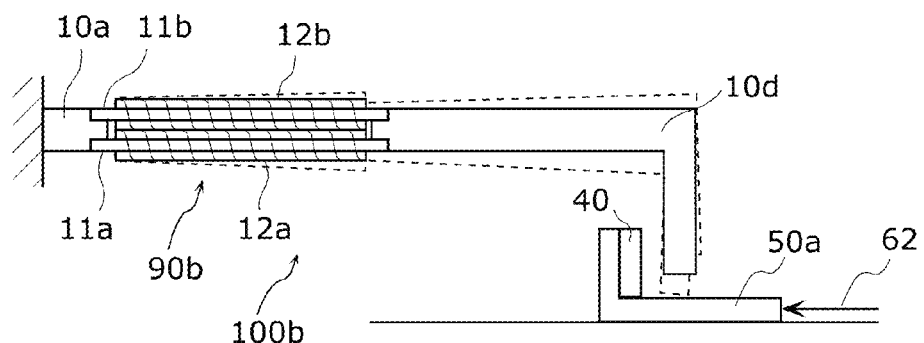
FIG. 11C is the third diagram showing the structure of the power generation switch according to Embodiment 2.

Next, with reference to FIGS. 11A to 11C, the description is given for a power generation switch that is operated by a user's action of sliding the operating part in a horizontal direction.

FIGS. 11A to 11C are diagrams showing a structure of a power generation switch 100b according to Embodiment 2. It should be noted that the same reference numerals in FIGS. 6A to 6C are assigned to the identical structural elements in FIGS. 11A to 11C, so that the identical structural elements are not described again below.

As shown in FIG. 11A, the power generation switch 100b includes a power generation element 90b and an operating part 50a.

The power generation element 90b differs from the power generation element 90 in that the connecting part 10b is replaced by a connecting part 10d. The connecting part 10d has an L-shaped end that is not connected to the power generation element 90b.

Next, as shown in FIG. 11B, when the user applies an external force 62 to the operating part 50a to slide the operating part 50a to a horizontal direction, the operating part 50a is displaced to the left in the horizontal direction, sticking to the connecting part 10d by the sticking force of the permanent magnet 40. As a result, a bending moment occurs in the connecting part 10d and the power generation element 90b.

Next, as shown in FIG. 11C, when a reaction force occurred in the connecting part 10d and the power generation element 90b exceeds the sticking force of the permanent magnet 40, the connecting part 10d starts free oscillation. Here, since the power generation element 90b performs free oscillation together with the connecting part 10d, an induction voltage is produced in the coils 12a and 12b.

It should be noted that the operating part does not necessarily have the permanent magnet 40.

Figure 12A:
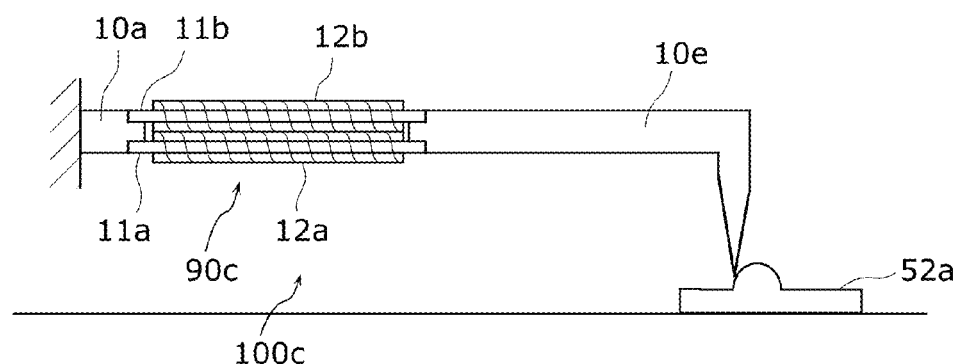
FIG. 12A is the first diagram showing a structure of a power generation switch according to a variation of Embodiment 2.
Figure 12B:
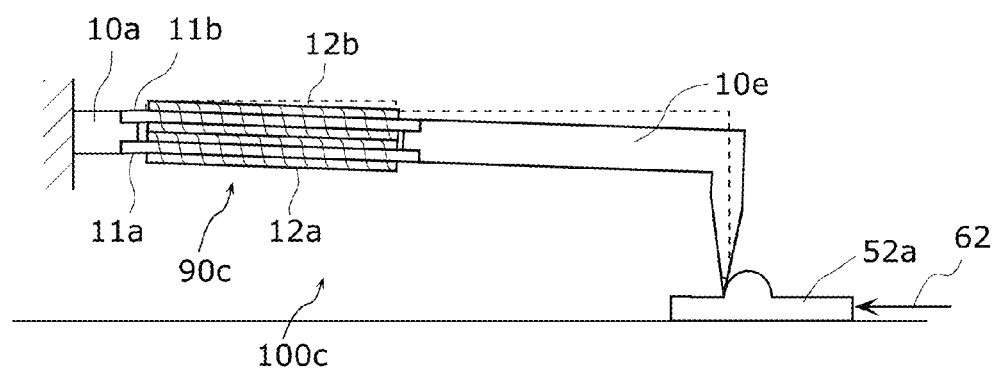
FIG. 12B is the second diagram showing the structure of the power generation switch according to the variation of Embodiment 2.
Figure 12C:
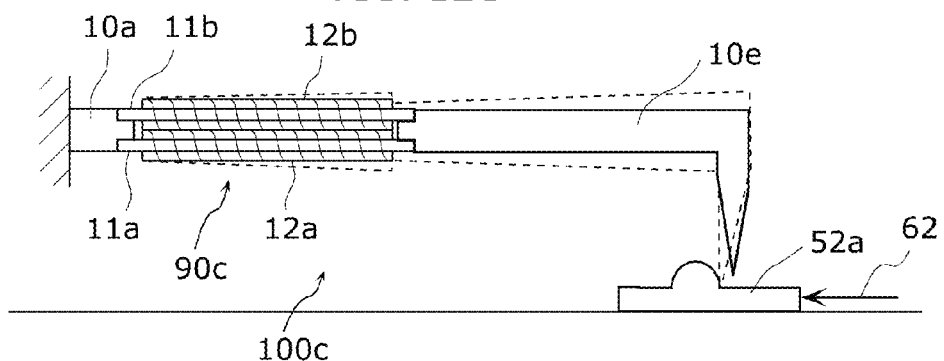
FIG. 12C is the third diagram showing the structure of the power generation switch according to the variation of Embodiment 2.

FIGS. 12A to 12C are diagram showing a variation of the power generation switch 100b according to Embodiment 2.

In the present variation, a physical nail structure is used instead of the permanent magnet 40. More specifically, as shown in FIGS. 12A to 12C, the power generation switch 100c according to the present variation includes a power generation element 90c and an operating part 52a. It should be noted that the same reference numerals in FIGS. 11A to 11C are assigned to the identical structural elements in FIGS. 12A to 12C, so that the identical structural elements are not described again below.

The power generation element 90c differs from the power generation element 90b in that the connecting part 10d is replaced by a connecting part 10e. The connecting part 10e has the L-shaped end with a sharp tip to be in contact with the operating part 52a.

The operating part 52a is an operating part having a convex part. The operating part 52a applies, to the connecting part 10e, an external force 62 produced by the user for sliding in a horizontal direction.

Such ends of the connecting part 10e and the operating part 52a cause the operating part 52a and the connecting part 10e to be less likely to in contact with each other. This structure makes it possible to adjust a maximum value of a bending moment applied by the operating part 52a to the connecting part 10e.

Embodiment 3

The following describes a structure of a power generation switch capable of enhancing a rigidity of the parallel beams while an external force which the user needs to produce is reduced by the principle of leverage.

Figure 13A:
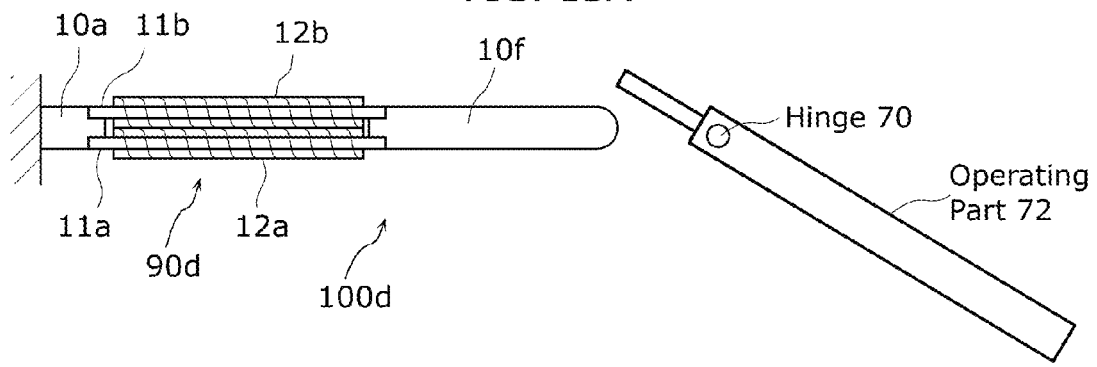
FIG. 13A is the first diagram showing a structure of a power generation switch according to Embodiment 3.
Figure 13B:
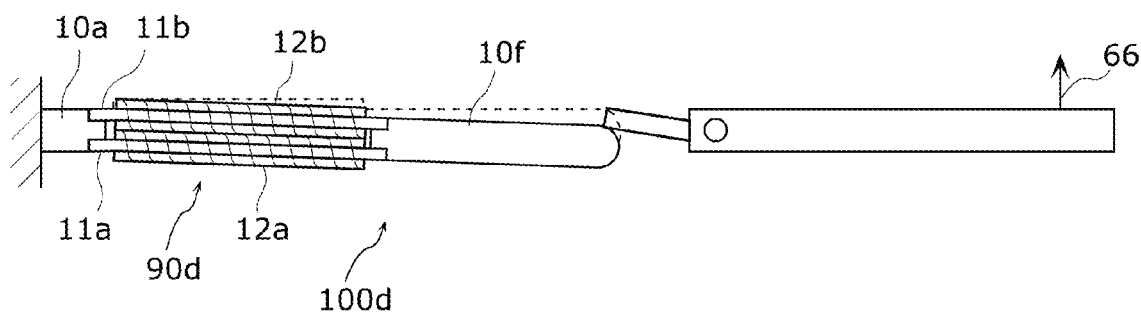
FIG. 13B is the second diagram showing the structure of the power generation switch according to Embodiment 3.
Figure 13C:
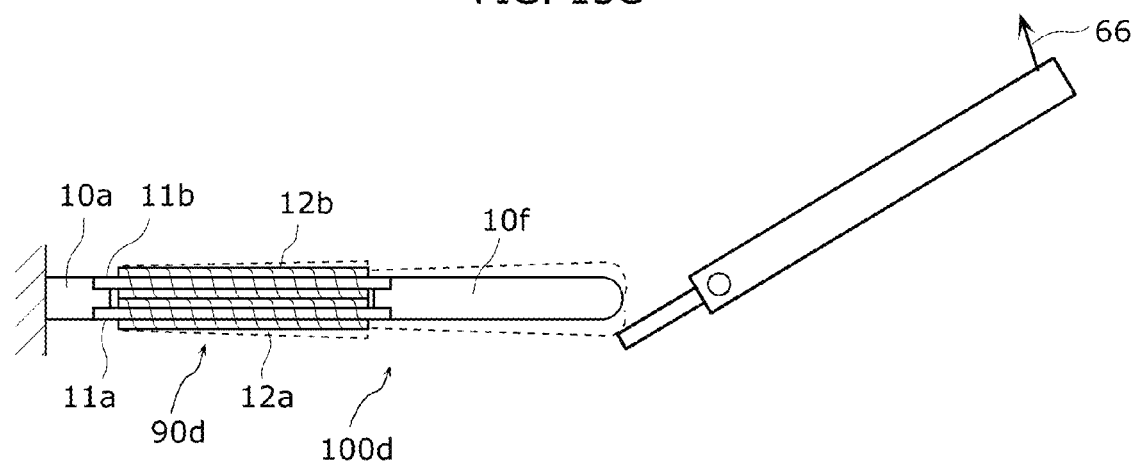
FIG. 13C is the third diagram showing the structure of the power generation switch according to Embodiment 3.

FIGS. 13A to 13C are diagrams showing a structure of a power generation switch 100d according to Embodiment 3.

As shown in FIG. 13A, the power generation switch 100d includes a power generation element 90d, a hinge 70, and an operating part 72.

As shown in FIGS. 13B and 13C, the hinge 70 functions as a pivot point, an end of the operating part 72 which is to be contact with the power generation element 90d functions as a point of load, and the other end of the operating part 72 which is applied with an external force by a user's operation functions as a point of effort. Therefore, when a distance from the pivot point to the point of effort is longer than a distance from the pivot point to the point of load, a magnitude of the external force 66 is amplified to be applied to a connecting part 10f. As a result, it is possible to more enhance the rigidity of the parallel beams included in the power generation element 90d without deteriorating an operability of the user.

As above, the power generation switches according to Embodiments 1 to 3 and their variations have been described. With the above structures, the magnetostrictive rods in the power generation switch is made of a magnetostrictive element having a ductibility. Therefore, a durability is high. In addition, the power generation switch allows the user to apply an external force to free ends of the parallel beams in a direction for causing a bending moment in the parallel beams. As a result, it is possible to oscillate the magnetostrictive element that is the power generation element with a higher resonant frequency, while a force which the user is required to operate the power generation switch is reduced. Therefore, more power can be generated.

It should be noted that the present invention is not limited to the above embodiments.

For example, it is also possible in each of the power generation switches according to of Embodiments 1 to 3 and their variations that the second connecting part capable of free oscillation has a substantially U shape. More specifically, the second connecting part may be bent in a substantially U shape as viewed from a flat surface including the surfaces of the two magnetostrictive rods included in the parallel beams.

As described above, among the connecting parts included in the power generation switch, the connecting part capable of free oscillation is desirably long. However, a long connecting part results in a problem of increasing a whole length of the power generation element.

Figure 14:
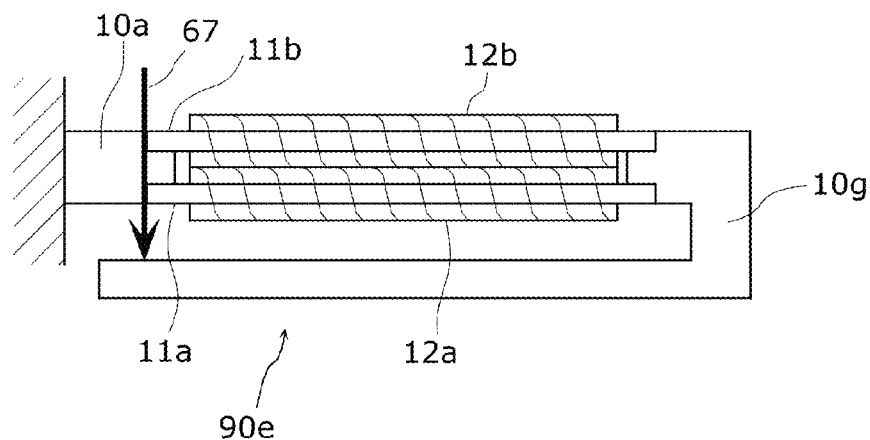
FIG. 14 is a diagram showing still another example of the power generation element included in the power generation switch according to any one of Embodiments 1 to 3 and their Variations.

Therefore, as shown in FIG. 14, the second connecting part 10g included in the power generation element 90e is bent in a substantially U shape with all corners in straight angles in the vertical plane. When the user applies an external force 67 to an end of the connecting part 10g which is not in contact with the parallel beams, the principle of leverage works in the same manner as the power generation element 90 shown in FIG. 6A. Therefore, it is possible to decrease the whole length of the power generation element 90 without deteriorating the rigidity of the parallel beams, while a magnitude of a force which the user is required to operate the power generation element 90 is reduced.

It should also be note that it has been described in each of Embodiments 1 to 3 and their variations that the power generation element includes the two magnetostrictive rods 11a and 11b, but one of the magnetostrictive rods may be replaced by a different material that is not a magnetostrictive material. It should also be noted that the connecting part in the power generation element may have a shape allowing the parallel-beam structure to consist of the connecting part and a single magnetostrictive rod. This structure is described in more detail below with reference to FIG. 15.

Figure 15:
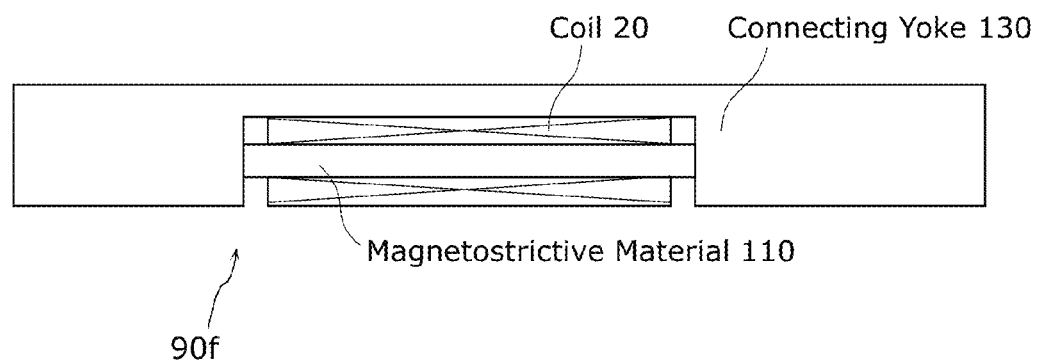
FIG. 15 is a diagram showing still another example of the power generation element included in the power generation switch according to any one of Embodiments 1 to 3 and their Variations.

FIG. 15 shows a power generation element 90f that includes a connecting yoke 130 and a magnetostrictive rod 110. The connecting yoke 130 as a connecting part has a substantially U shape with all corners in straight angles, with a trench in a longitudinal direction at the center of one side of the connecting yoke 130 having a shape of a cuboid with the trench. The magnetostrictive rod 110 having a column shape is arranged in the trench of the connecting yoke 130 in parallel to the longitudinal direction. The magnetostrictive rod 110 is contact with the inside of the trench to be jointed with the connecting yoke 130.

As shown in FIG. 15, the power generation element 90f includes a single magnetostrictive rod. However, a material and a shape of the central part of the connecting yoke 130 in a longitudinal direction are set to have almost the same rigidity of the magnetostrictive rod 110, so that the central part of the connecting yoke 130 in the longitudinal direction and the magnetostrictive rod 110 can form a parallel-beam structure. Therefore, as shown in, for example, FIG. 6A, even if the power generation element 90f is used instead of the power generation element 90, the same effects as described previously can be offered.

More specifically, it is also possible that a power generation switch that is driven by power generated by an inverse magnetostriction effect caused in a magnetostrictive element, the power generation switch comprising: parallel beams at least one of which is a magnetostrictive rod made of a magnetostrictive material in a beam shape; a coil wound around the magnetostrictive rod; a first connecting part connecting, at respective first ends of the parallel beams, two beams included in the parallel beams to each other; a second connecting part connecting, at respective second ends of the parallel beams, the two beams included in the parallel beams to each other, the second ends being different from the first ends; a field part that produces magnetic flux to pass through the two beams in a same direction; and an operating part that is operated by a user, wherein the first connecting part is a fixed end that is not displaced, the second connecting part is a free end capable of free oscillation, and the operating part applies an external force to the second connecting part so as to cause free oscillation of the parallel beams, the free oscillation (i) causing a positive axial force in one of the two beams and (ii) causing a negative axial force in an other one of the two beams.

Figure 16A:
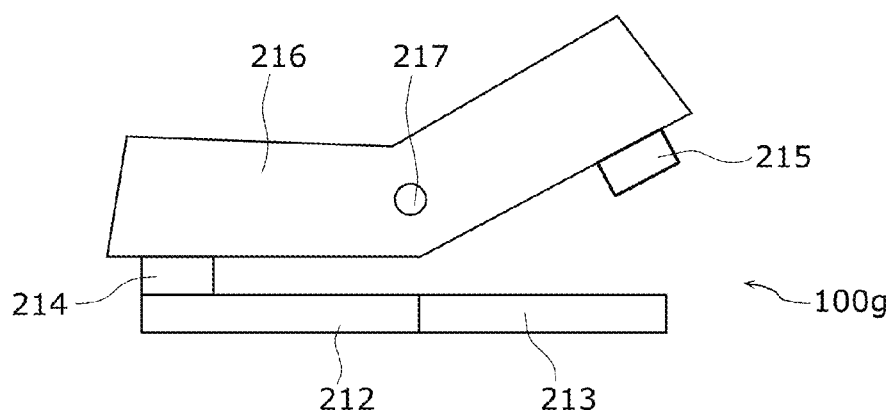
FIG. 16A is the first schematic diagram of a power generation switch implemented to a seesaw switch.
Figure 16B:
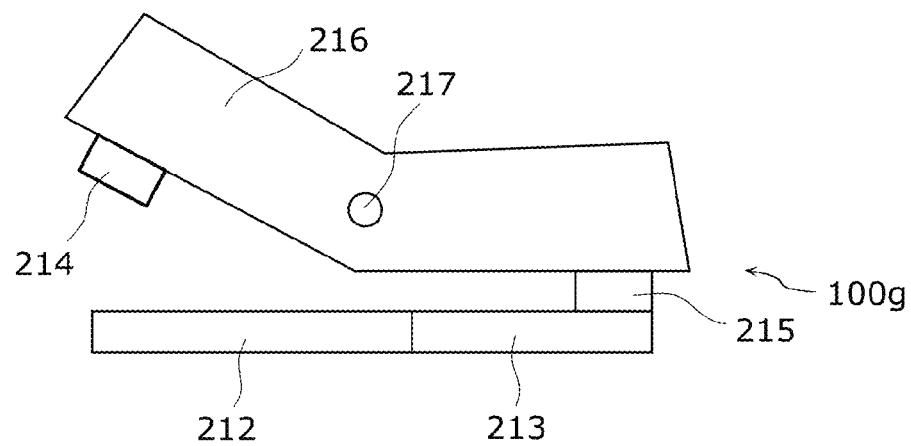
FIG. 16B is the second schematic diagram of the power generation switch implemented to the seesaw switch.

Furthermore, as shown in FIGS. 16A and 16B, the power generation element may be a seesaw-type (locker-type) power generation switch 100g that includes: two power generation elements 212 and 213; the permanent magnets 214 and 215 which stick to the two power generation elements 212 and 213, respectively; an operating part 216 having a dog-leg shape; and a hinge 217.

The power generation elements 212 and 213 are jointed with each other at their ends in a longitudinal direction. The joint ends are fixed ends. The other ends of the power generation elements 212 and 213 are free ends.

In the state shown in FIG. 16A, the permanent magnet 214 sticks to the power generation element 212. Here, when the user presses the end of the dog-leg-shaped operating part which does not stick to any of the power generation elements (in other words, the right-hand end in the figure), the permanent magnet 214 bends the power generation element 212 upwards and then releases the sticking power generation element 212. Thereby, free oscillation of the fee end of the power generation element 212 occurs. As a result, the power generation element 212 generates power. Next, the permanent magnet 215 sticks to the power generation element 213 to be the state shown in FIG. 16B. Here, when the user presses the end of the dog-leg-shaped operating part which does not stick to any of the power generation elements (in other words, the left-hand end in the figure), the permanent magnet 215 bends the power generation element 213 upwards and then releases the sticking power generation element 213. Thereby, free oscillation of the fee end of the power generation element 213 occurs. As a result, the power generation element 213 generates power. As described above, in the power generation switch 100g, every time the two states shown in FIGS. 16A and 16B are switched, the two power generation elements having such a cantilever structure alternately generate power.

It should be note that FIG. 14 shows the example of the power generation element 90e in which the second connecting part 10g is bent in a substantially U shape with all corners in straight angles as viewed from the flat surface including the surfaces of the two magnetostrictive rods 11a and 11b included in the parallel beams, but the directions of the bending at the two corners are not limited to the above. For example, the second connecting part 10g may be bent in a substantially U shape as viewed from a flat surface perpendicular to the flat surface including the surfaces of the two magnetostrictive rods 11a and 11b included in the parallel beams. In other words, as long as the second connecting part 10g is bent in a substantially U shape (in other words, in a shape bending towards the fixed end, for example, a substantially J shape), the second connecting part 10g may be bent in a desired direction.

Figure 17:
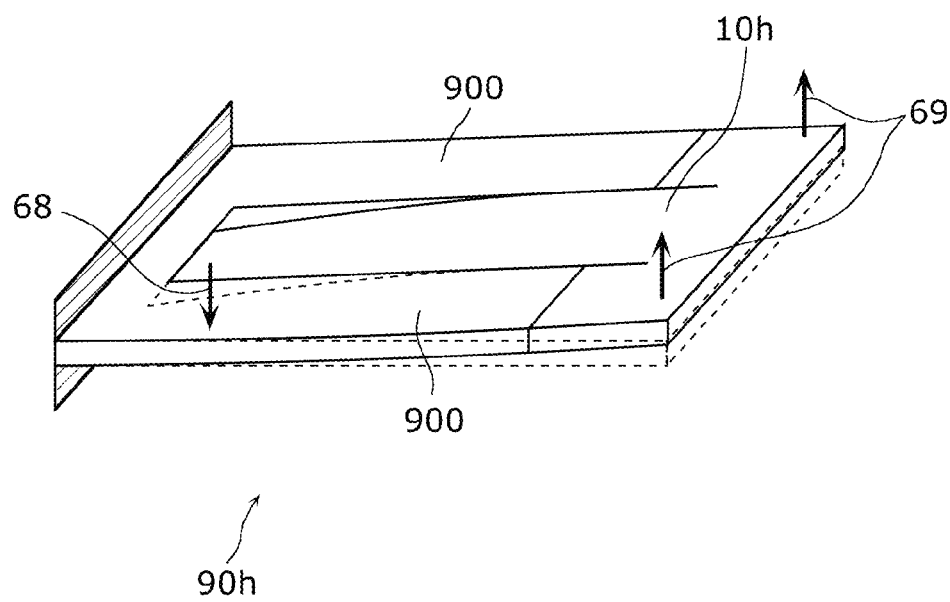
FIG. 17 is a diagram showing still another example of the power generation element included in the power generation switch according to any one of Embodiments 1 to 3 and their Variations.
Figure 18:
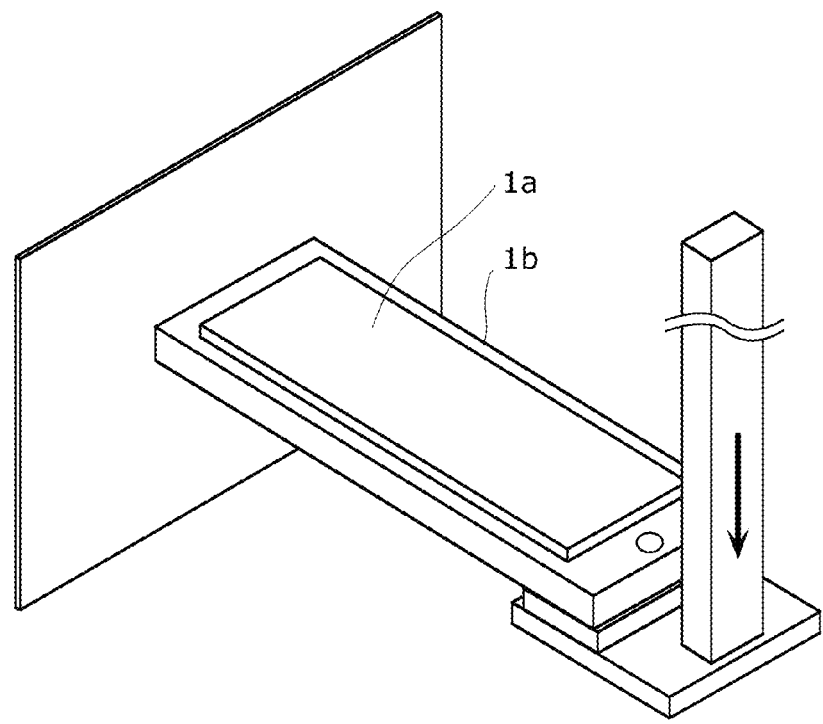
FIG. 18 is a schematic diagram showing a structure of a power generation switch according to an prior art.

Furthermore, as shown in FIG. 17, a power generation element 90h including a T-shaped connecting part is also possible. The power generation element 90h includes two power generation elements 900 and a connecting part 10h. Although not show in FIG. 17, each of the power generation elements 900 has basically the same structure as that of the power generation element 90 shown in FIG. 6A and is fixed to a wall or the like in the same direction as that of the power generation element 90. However, each of the power generation elements 900 differs from the power generation element 90 in that the connecting part 10b is not provided.

The connecting part 10h is a T-shaped connecting part. The connecting part 10h has a bar part corresponding a T-shaped crossbar. Instead of the connecting part 10b, the left and right ends of the bar part firmly connect ends (free ends) of the two magnetostrictive rods in the power generation element 900 to each other. As a result, the two power generation elements 900 are connected to each other via the connecting part 10h. Here, when an external force 68 is applied to the other end of the connecting part 10h (in other words, the end corresponding to a T-shaped lower end), the principle of leverage causes a large reaction force 69, which is larger than the external force 68, to the bar part of the T-shaped connecting part 10h (in other words, the ends connecting the two power generation elements 900 together). This reaction force produces a bending moment in the power generation elements 900. More specifically, in the power generation element 90h, it is possible to use a smaller external force 68 to cause a large bending moment in the two power generation elements 900, while a whole length of the power generation element is decreased. Moreover, since the connecting part 10h has the T shape to cause the bending moment equally to the left and right power generation elements 900, the two power generation elements 900 are deformed only at the flat surface including two magnetostrictive rods included in each of the power generation elements 900.

It should be noted that, as described earlier, each of the connecting parts 10a to 10h according to Embodiments 1 to 3 and their variations is not necessarily made of the same material to be integrated as one structure, as long as at least one end of the connecting part is made of a magnetic material to be magnetically jointed with two magnetostrictive rods. For example, as shown in FIG. 6A, the free end of the connecting part 10b is desirably rigid, long, and light. It is therefore possible that the left-hand end of the connecting part 10b is made of a magnetic material such as iron so as to be physically and magnetically jointed with the coils 12a and 12b, and the other part of the connecting part 10b is made of a rigid and light material, such as aluminium or carbon.

Other various embodiments as below are also possible.

Embodiment 4

Figure 19:
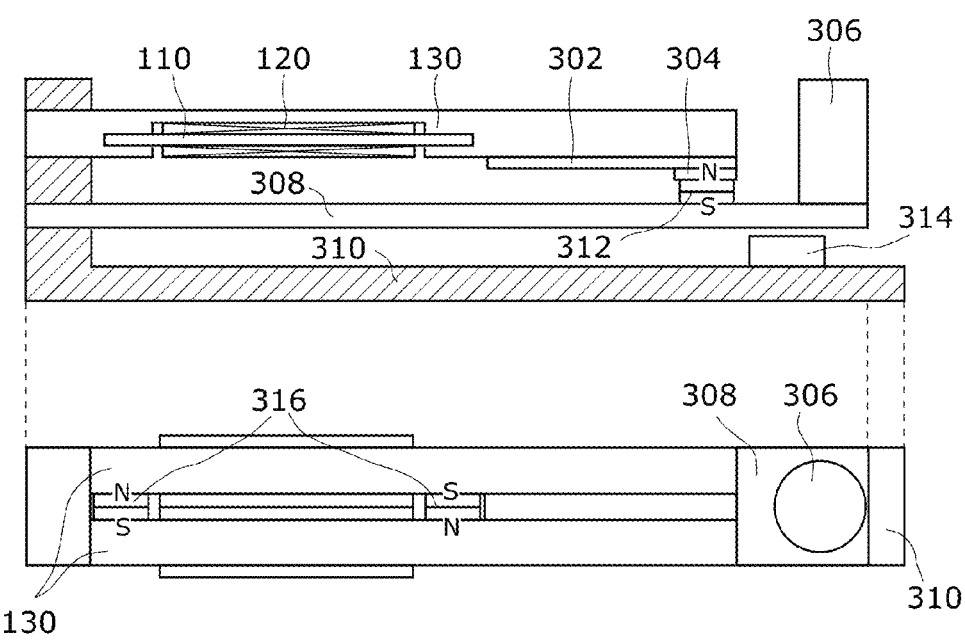
FIG. 19 is a diagram showing the structure of the power generation switch according to Embodiment 4.

For example, another embodiment of the power generation switch shown in FIG. 19 includes magnetostrictive rods 110, coils 120, connecting yokes 130, a connecting plate 302, a stiction plate 304, a projection 306, a switch board 308, a fixed base 310, a permanent magnet 312, permanent magnets 316, and a stopper 314.

Here, the permanent magnet 312 is a switch magnet that sticks to the switch board 308. The permanent magnets 316 are bias magnets that produce a bias magnetic flux in the magnetostrictive rods 110. The switch board 308 may be a magnetic material or may not be a magnetic material.

A set of a single magnetostrictive rod 110, a single coil 120, and a single connecting yoke 130 forms a single power generation element. An end of each of two power generation elements is jointed with the fixed base 310. The respective other ends of the two power generation elements are connected to each other via the connecting plate 302. As a result, the two power generation elements are integrated together to oscillate. It should be noted that the connecting plate 302 is desirably made of a non-magnetic material not to leak the bias magnetic flux.

Furthermore, the stiction plate 304 made of a magnetic material is provided to the lower side of the connecting plate 302.

The switch board 308 is made of a spring material. One end of the switch board 308 is jointed with the fixed base 310. The other end of the switch board 308 is provided with the projection 306. The projection 306 is made of, for example, a rubber having a cylinder shape.

The permanent magnet 312 is provided on the top surface of the switch board 308 to face the stiction plate 304. The permanent magnet 312 sticks to the stiction plate 304 by a magnetic force.

Here, when the user presses the projection 306, the switch board 308 is bent. Here, the power generation elements are also bent. Due to the bending, in the parallel-beam structure consisting of the connecting yokes 130 and the magnetostrictive rods 110, a large contracting force is applied to the magnetostrictive rods 110 in a longitudinal direction. As a result, the inverse magnetostriction effect reduces the magnetic flux in the magnetostrictive rods 110.

After that, when the user further presses the projection 306, the permanent magnet 312 comes off from the stiction plate 304. Thereby, free oscillation of the power generation elements occurs. In the free oscillation, a contraction and a pulling stress are alternately applied in the magnetostrictive rods 110, so that the magnetic flux in the magnetostrictive rods 110 is also alternately changed. This temporal change of the magnetic flux produces an electromotive force in the coils 120.

It should be noted that the present embodiment is characterized, as a practical idea, by the provision of the stopper 314 between the switch board 308 and the fixed base 310 to prevent the switch board 308 from being extremely bent.

It should be noted that the permanent magnet 312 as a switch magnet may be fixed to a part (for example, the connecting plate 302) provided at the side of the power generation element, instead of the switch board 308. In this case, a mass of the ends of the power generation elements becomes heavy. Therefore, while a power generation efficiency is decreased, there are advantages that a sticking force of magnetism is always applied to the same position of the power generation elements. For example, even if the initial relative positions of the switch board 308 and the power generation elements are changed, a position where a sticking force applied to the power generation elements when the switch board 308 comes off from the permanent magnet 312 is not changed. As a result, the generated power amount is stable and with a repeatability.

It should be noted that, when the permanent magnet 312 as a switch magnet is provided to the part at the side of the power generation elements, it is also possible, for example, that two permanent magnets are arranged adjacent to each other to have opposite magnetic poles, thereby forming a closed magnetic circuit. The closed magnetic circuit can prevent that magnetic field lines caused by the permanent magnet 312 as a switch magnet enter the magnetostrictive rods 110 via the connecting yokes 130.

It is further possible that an elastic part such as a rubber plate is provided between the permanent magnet 312 as a switch magnet and a part that repeatedly sticks to and comes off from the permanent magnet 312. Thereby, it is possible to reduce shock caused when the permanent magnet 312 sticks to the part.

Figure 20:
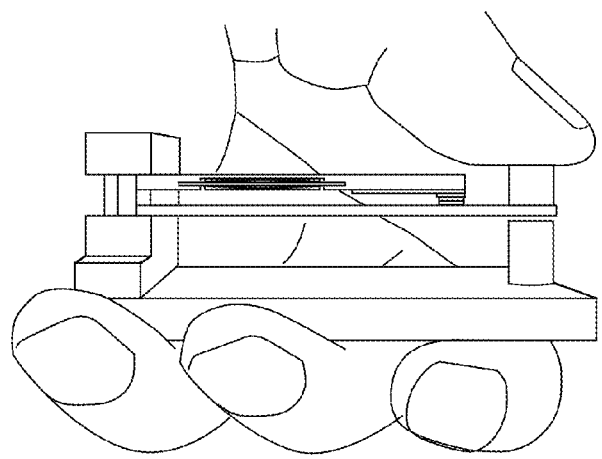
FIG. 20 is a diagram showing a prototype example of the power generation switch according to Embodiment 4.

FIG. 20 shows a prototype example of the power generation switch according to the present embodiment. The power generation switch includes a magnetostrictive element having dimensions of 2 mm×0.5 mm×22 mm, and a coil having the number of turns of 1260. One pressing of a button can result in an instantaneous voltage of 15 V, instantaneous power of 0.2 W, and electrical energy of 0.5 mJ at maximum.

Embodiment 5

Figure 21A:
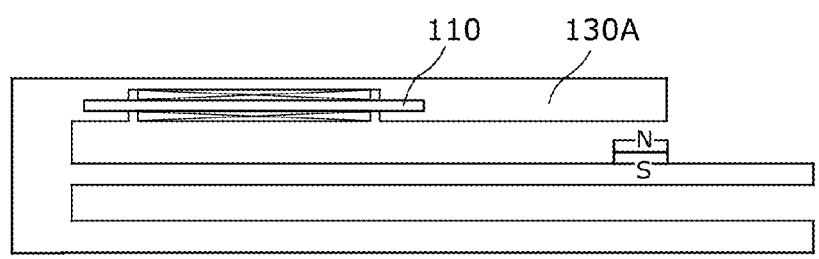
FIG. 21A is a diagram showing a structure of a power generation switch according to Embodiment 5.
Figure 21B:
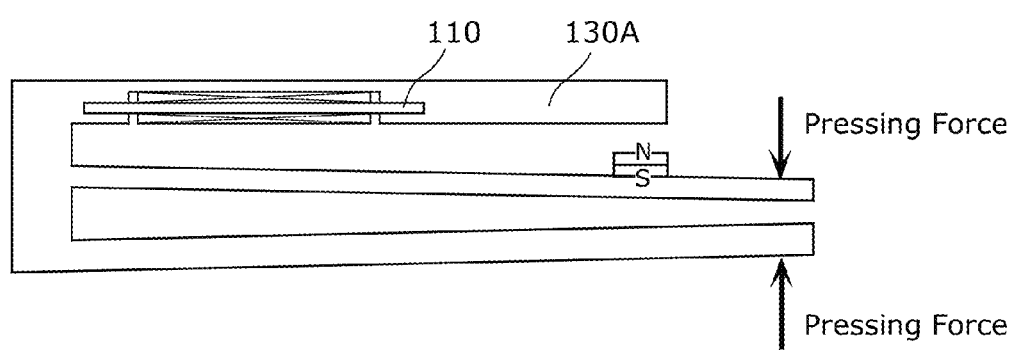
FIG. 21B is a diagram showing a situation where the power generation switch shown in FIG. 21A is used.
Figure 21C:
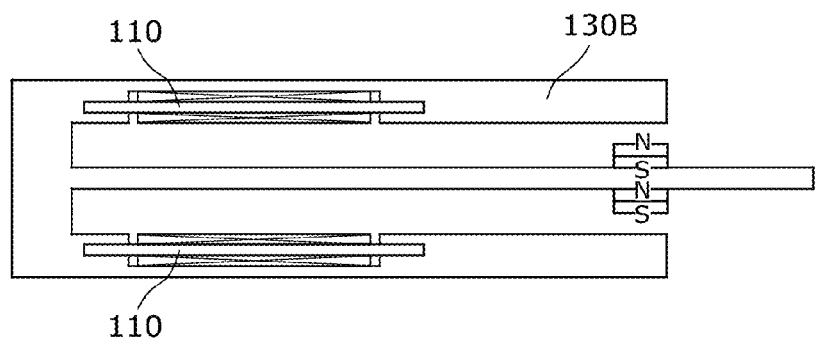
FIG. 21C is a diagram showing a structure of a power generation switch according to a variation of Embodiment 5.

Next, with reference to FIGS. 21A to 21C, still another embodiment of the power generation switch is described. It should be noted that the connecting plate and the switch board are not explained again in the following embodiments. It should also be note that the number of power generation elements may be at least one.

FIG. 21A shows a power generation switch in which a connecting yoke 130A, a switch board, and a fixed base are integrated together. In other words, in the present embodiment, the yoke, the switch board, and the fixed base are integrated as a single structure. This structure can decrease the number of structural parts and simplifies assembly. As a result, a cost can be reduced.

It should be noted that, in order to enhance a durability of the parts, it is possible to perform heat treatment, such as simulated annealing, on the parts after having been integrated.

FIG. 21B shows a state where the power generation switch shown in FIG. 21A is used. By applying a force for decreasing a distance between the fixed base and the switch board, free oscillation of the power generation element having the magnetostrictive rod 110 occurs. As a result, the power generation switch generates power.

With this structure, a force, such as a gripping force, can cause power generation.

It should be noted that, as shown in FIG. 21C, the power generation switch may include two power generation elements. In this structure, connecting yokes 130B and a switch board are integrated together.

This structure allows the upper and lower power generation elements to occur free oscillation with upward and downward forces applied to the switch board. In other words, the power generation switch according to the present embodiment can generate power by any of bipolar selective operations (ON and OFF, for example).

Embodiment 6

Figure 22A:
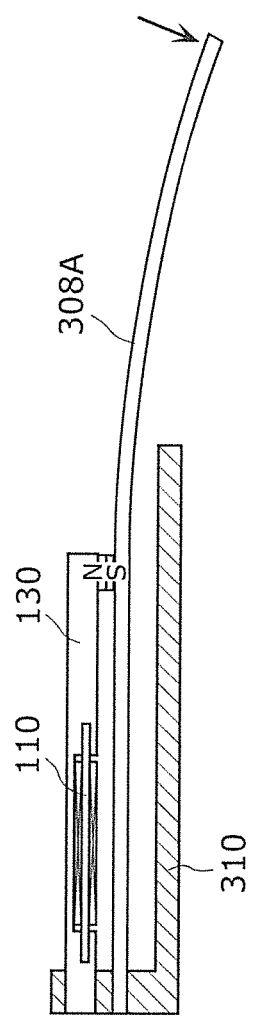
FIG. 22A is a diagram showing a structure of a power generation switch according to Embodiment 6.
Figure 22B:
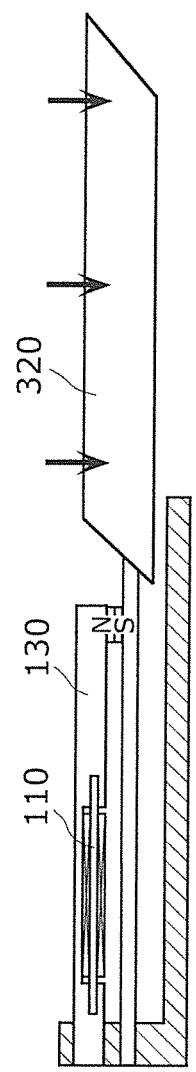
FIG. 22B is a diagram showing a structure of a power generation switch according to Variation 1 of Embodiment 6.

Next, with reference to FIGS. 22A to 22C, other embodiments of the power generation switch are described.

FIG. 22A shows a power generation switch in which a switch board 308A is made of a longer spring material. In general, a longer switch board results in a smaller power required for releasing stiction caused by a magnetic force (in other words, a smaller power required to start power generation). However, a longer switch board is more likely to have plastic deformation. Therefore, a material of the switch board is desirably a copper phosphate, a hyperelastic material, or the like which has a high strength against being pulled and a high spring property.

It should be note that, as shown in FIG. 22B, a flat plate 320 may be provided to the end of the switch board. With this structure, a wind pressure, a water pressure, or the like can be used as a force pressing the switch board. More specifically, a wind, a water current, a fall of waterdrop (object) and the like can be used.

It should also be note that, as shown in FIG. 22C, a weight 322 may be provided to the end of the switch board. In this case, a fictitious force applied to the weight can be used as a force pressing the switch board. For example, if an upward acceleration is applied to the power generation switch, the weight 322 is subjected to a fictitious force to be still. The fictitious force causes stiction of the switch board caused by a magnetic force to be off. As a result, the power generation switch starts power generation.

Embodiment 7

Next, the description is given for still another embodiment of the power generation switch that is placed on a flexible structure and generates power by deformation of the flexible structure.

Figure 23A:
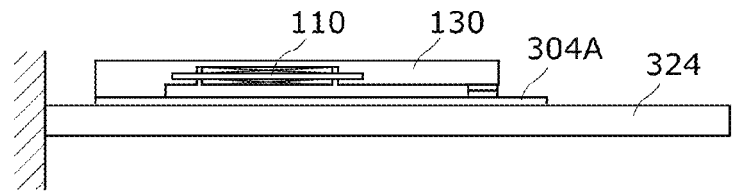
FIG. 23A is the first diagram showing a structure of a power generation switch according to Embodiment 7.

FIG. 23A shows a power generation switch in which an stiction plate 304A made of a bendable magnetic material is jointed with a top surface of a rubber plate 324 that is an example of the flexible structure. Furthermore, a power generation element including a magnetostrictive rod 110 and a connecting yoke 130 is fixed on the stiction plate 304A. More specifically, one end of the power generation element is firmly fixed to the stiction plate 304A or the rubber plate 324. Here, a switch board is sticked by a magnetic force.

Figure 23B:
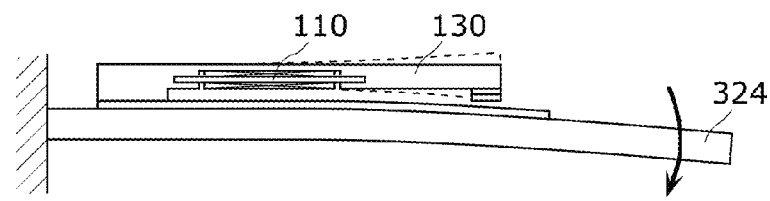
FIG. 23B is the second diagram showing the structure of the power generation switch according to Embodiment 7.

Here, when the rubber plate 324 is greatly bent, the switch board coming off from a permanent magnet starts free oscillation (see FIG. 23B). As a result, power is generated.

Figure 23C:
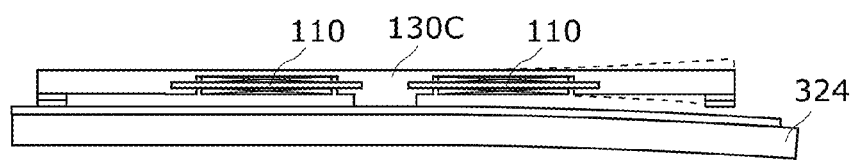
FIG. 23C is a diagram showing a structure of a power generation switch according to Variation 1 of Embodiment 7.

If both ends of the flexible structure (here, the rubber plate 324) are not fixed, the flexible structure is not homogeneously deformed. Therefore, the magnet may not come from the flexible structure. In order to avoid such a situation, it is conceived, as shown in FIG. 23C, a power generation element that includes two magnetostrictive rods 110 and a T-shaped connecting yoke 130C. With this structure, if at least a part of the rubber plate 324 is bent, one of the left and right power generation elements comes off from the stiction plate 304A, thereby starting power generation.

Figure 24A:
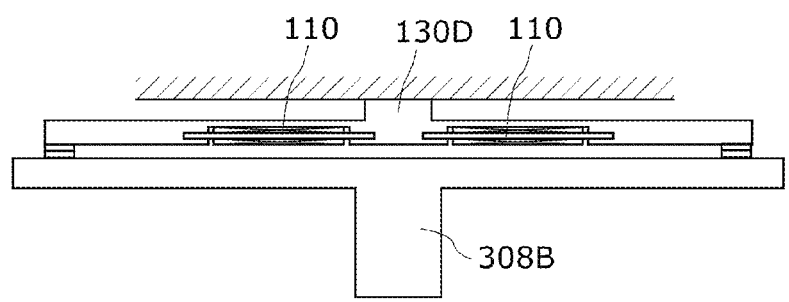
FIG. 24A is the first diagram showing a structure of a power generation switch according to Variation 2 of Embodiment 7.
Figure 24B:
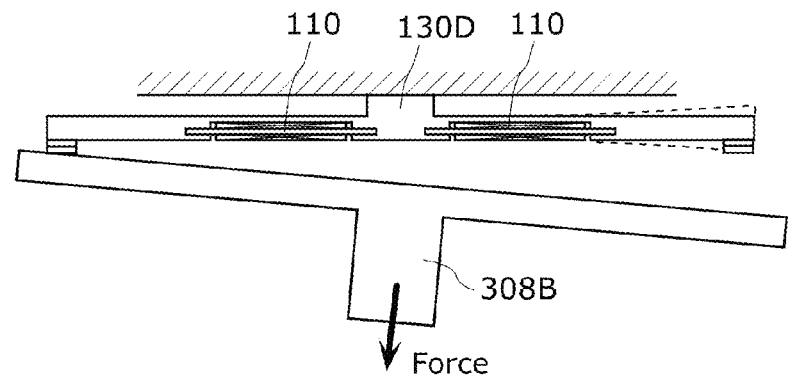
FIG. 24B is the second diagram showing the structure of the power generation switch according to Variation 2 of Embodiment 7.

It should be noted that, as shown in FIGS. 24A and 24B, it is also possible to provide a power generation switch in which a T-shaped switch board 308B serves as a switch. In this case, a force in any direction among a downward direction, a rightward direction, and a leftward direction, which is applied to a projection part of the T-shaped switch board 308B, causes the switch board 308B to come off from the power generation element, thereby starting power generation.

Embodiment 8

Next, an embodiment of the power generation switch that generates power when a door is opened and closed is described with reference to FIGS. 25A and 25B.

Figure 25A:
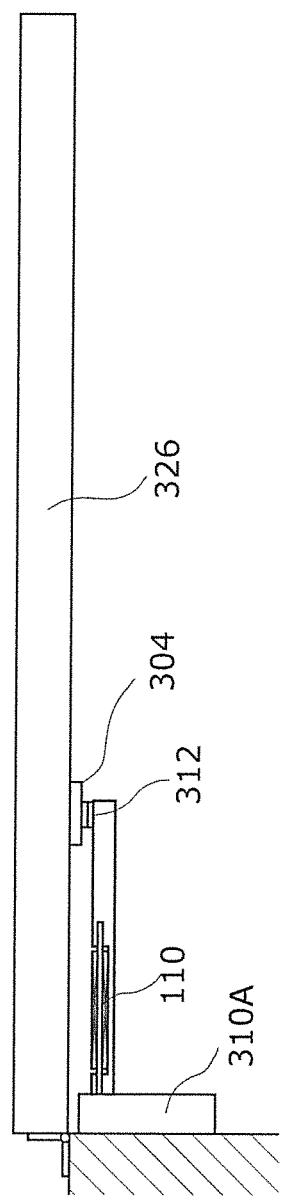
FIG. 25A is the first diagram showing a structure of a power generation switch according to Embodiment 8.

As shown in FIG. 25A, one end of a power generation element including a magnetostrictive rod 110 is fixed to a fixed base 310, and the other end of the power generation element is provided with a permanent magnet 312. One end of a door 326 is fixed to the fixed base 310A by a hinge or the like. Therefore, the door 326 is capable of opening and closing around an axis. The axis is a side of the door 326 to which the hinge or the like is fixed. If the door 326 is made of a non-magnetic material, the door 326 has a stiction plate 304 that is made of a magnetic material and faces the permanent magnet 312.

Here, FIG. 25A shows the state where the door 326 is closed. When the door 326 is closed, the permanent magnet 312 sticks to the door 326 (or the stiction plate 304).

Figure 25B:
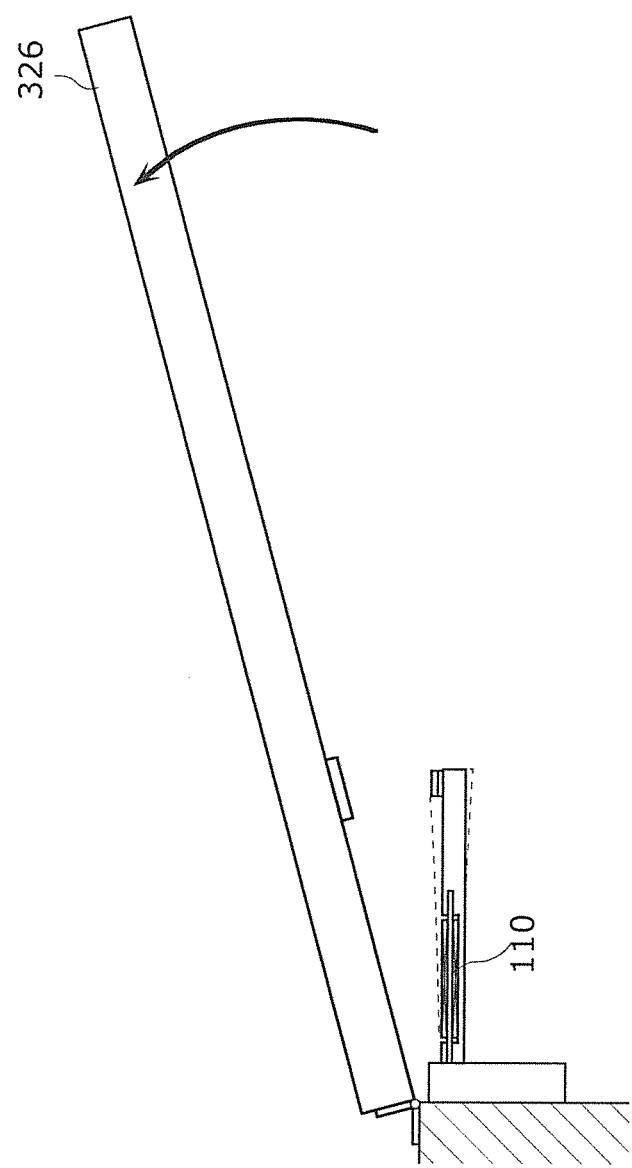
FIG. 25B is the second diagram showing the structure of the power generation switch according to Embodiment 8.

Next, when the door 326 is opened as shown in FIG. 25B, the force of opening the door 326 causes the permanent magnet 312 to come off form the door 326. As a result, free oscillation of the power generation element including the magnetostrictive rod 110 occurs, and the power generation element thereby starts power generation.

Figure 26A:
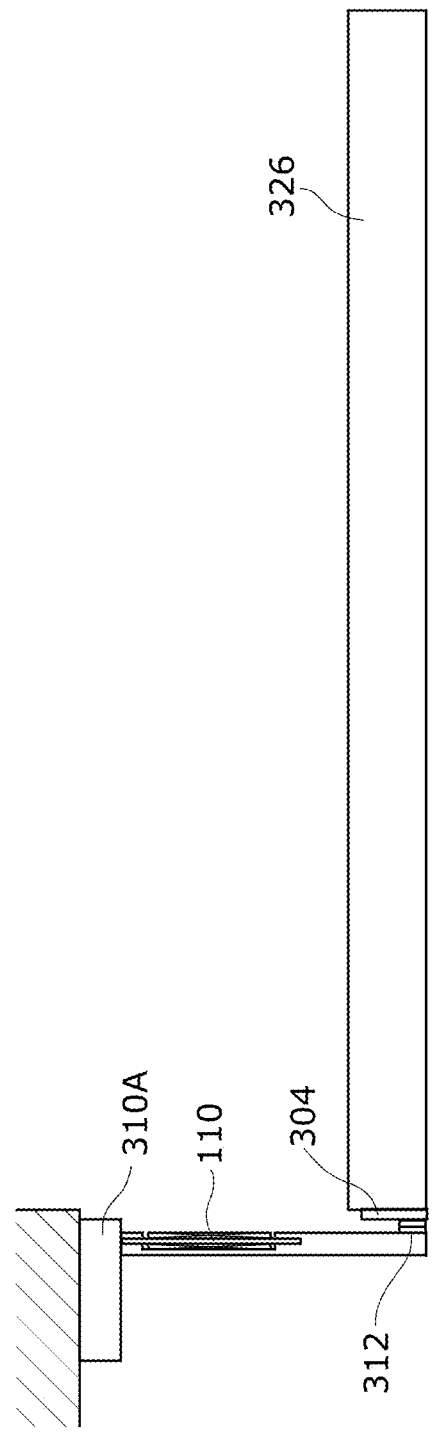
FIG. 26A is the first diagram showing a structure of a power generation switch according to a variation of Embodiment 8.

A variation of the present embodiment in which the door is a sliding door is shown in FIGS. 26A and 26B.

As shown in FIG. 26A, one end of a power generation element including the magnetostrictive rod 110 is fixed to a fixed base 310A, and the other end of the power generation element has a side surface provided with a permanent magnet 312. Here, the power generation element including the magnetostrictive rod 110 is fixed to be perpendicular to a direction of sliding the door 326 (in other words, fixed to be perpendicular to a left-right direction in the figure).

The other end of the door 326 which faces the permanent magnet 312 has a stiction plate 304 made of a magnetic material. If the door 326 is made of a magnetic material, it is not necessary to provide the stiction plate 304 to the end.

Here, FIG. 26A shows the state where the door 326 is closed. When the door 326 is closed, the permanent magnet 312 sticks to the door 326 (or the stiction plate 304).

Next, when the door 326 is opened as shown in FIG. 26B, the force of sliding the door 326 causes the permanent magnet 312 to come off form the door 326. As a result, free oscillation of the power generation element including the magnetostrictive rod 110 occurs, and the power generation element thereby starts power generation.

Thus, the power generation switch using opening and closing of a door is useful especially for monitoring people coming and going through the door. For example, it is considered that a management system for security, caring, welfare, air circulation of an area, or the like turns a lamp ON or OFF according opening or closing of the door, or wirelessly transmits information of the opening or closing.

Embodiment 9

Next, an embodiment of an power generation switch that is embedded in a floor is described with reference to FIGS. 27A to 27D.

Figure 27A:
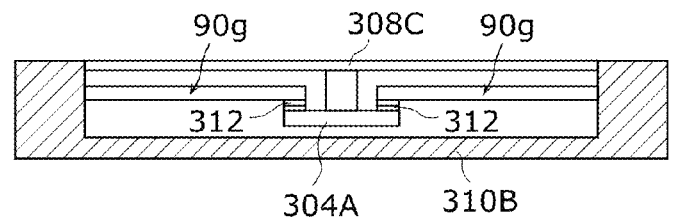
FIG. 27A is the first diagram showing a structure of a power generation switch according to Embodiment 9.

As shown in FIG. 27A, the power generation switch according to the present embodiment includes a switch board 308C, power generation elements 90g, permanent magnets 312, a stiction plate 304A, and a fixed base 310B.

Both ends of the switch board 308C are fixed to the fixed base 3108. Each of the two power generation elements 90g has one end fixed to the fixed base 310B and the other free end. The respective free ends of the two power generation elements 90g face each other.

The switch board 308C has a stiction plate 304A in the shape of an inversed T. The stiction plate 304A has the permanent magnets 312 each of which faces a corresponding one of the power generation elements 90g to stick to the corresponding power generation elements in an upward direction.

Here, if FIG. 27A shows an initial state, the stiction plate 304A sticks to the side of the power generation elements 90g by a magnetic force at the initial state.

Figure 27B:
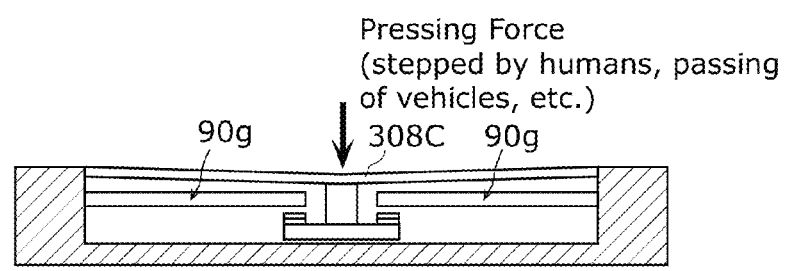
FIG. 27B is the second diagram showing the structure of the power generation switch according to Embodiment 9.
Figure 27C:
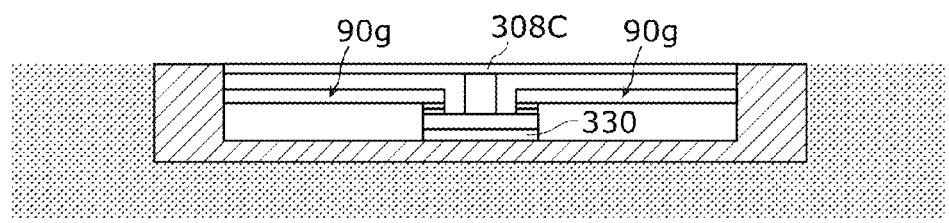
FIG. 27C is a diagram showing a structure of a power generation switch according to a variation of Embodiment 9.

Then, when the switch board 308C is pressed, the stiction plate 304A comes off from the power generation elements 90g as shown in FIG. 27B, and the power generation elements 90g thereby start free oscillation. It should be noted that, as shown in FIG. 27C, it is also possible that a buffer material 330 is provided between the stiction plate 304A and the fixed base 310B.

In other words, in the power generation switch according to the present embodiment, one end of the first connecting part in each of the power generation elements 90g is fixed to an inner surface of an opening of the fixed base 310B. The operation part includes the switch board 308C and the stiction plate 304A. The switch board 308C is a lid part covering the opening of the fixed base 310B. The stiction plate 304A is a plate part which is jointed with the switch board 308C and is in contact with the second connecting parts in the opening of the fixed base 310B. Here, when the switch board 308C is bent by an external force, for example, when the switch board 308C is bent by being stepped by a human or pressed by a passing vehicle, the switch board 308C applies the external force to the second connecting parts via the stiction plate 304A to cause free oscillation of the parallel beams. As a result, the power generation elements 90g start power generation.

According to the present embodiment, since both ends of the switch board 308C are fixed to the fixed base 310B, it is possible to easily keep a sealing property between the switch board 308C and the fixed base 310B. As a result, the power generation switch according to the present embodiment has a structure with a high waterproof property and a high durability.

The power generation switch according to the present embodiment can be buried in a floor or a road, for example.

Thereby, the power generation switch can generate power when a human or a vehicle passes on the floor or road.

Figure 27D:
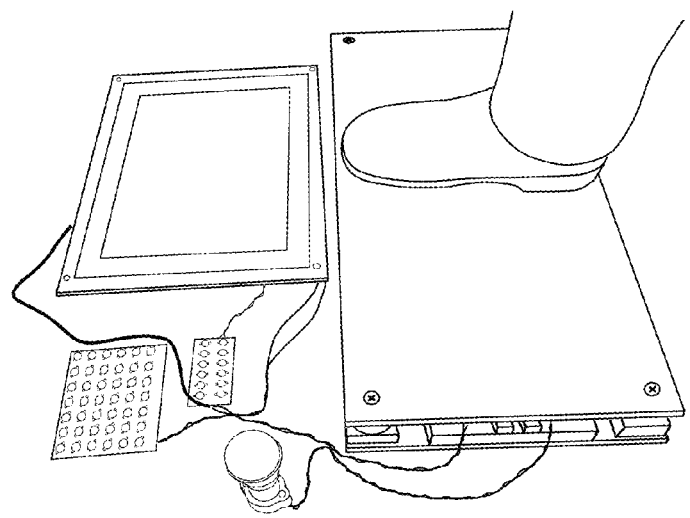
FIG. 27D is a diagram showing a prototype example of the power generation switch according to Embodiment 9.

FIG. 27D shows a prototype example of the power generation switch according to the present embodiment. The switch board 308C has a shape of 600 mm×300 mm. The switch board 308C includes two power generation elements. When a human steps on the switch board 308B, the power generation switch can generate instantaneous power of approximately 10 W and electrical energy of approximately 0.2 J at maximum.

Embodiment 10

Figure 28A:
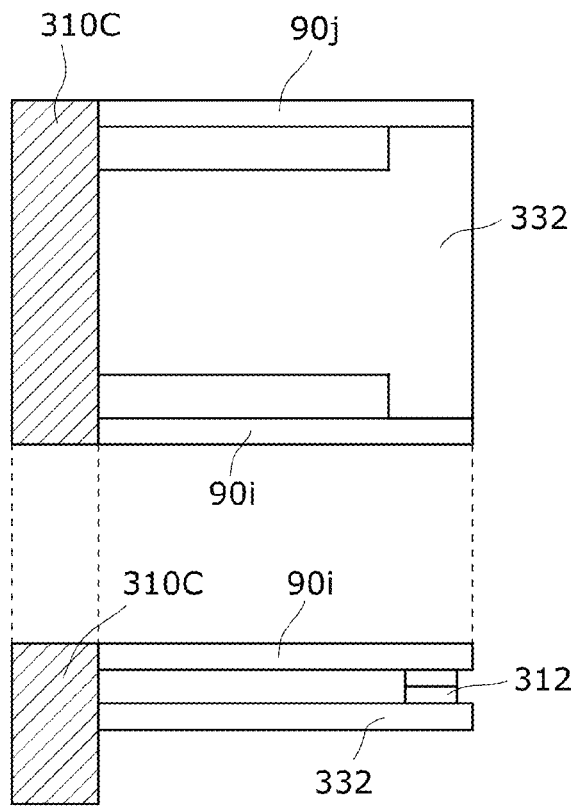
FIG. 28A is the first diagram showing a structure of an operation position detection system according to Embodiment 10.
Figure 28B:
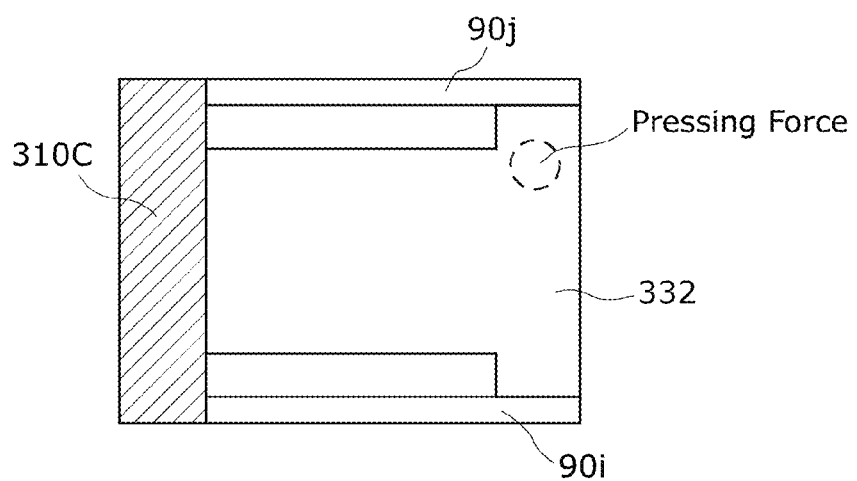
FIG. 28B is the second diagram showing an example of the structure of the operation position detection system according to Embodiment 10.

Next, the description is given for an operation position detection system according to another embodiment with reference to FIGS. 28A to 28C. The operation position detection system is assumed to be used for a remote controller or the like which includes a plurality of buttons, for example.

As shown in FIG. 28A, the operation position detection system according to the present embodiment includes a fixed base 310C, power generation elements 90j and 90i, and a switch board 332.

One end of each of the power generation elements 90j and 90i is fixed to the fixed base 310C. One end of the switch board 332 is also fixed to the fixed base 310C.

The other end of each of the power generation elements 90j and 90i sticks to the other end of the switch board 332 by a magnetic force of a permanent magnet 312.

Here, as shown in FIG. 28B, when the user presses a higher position than the center on the switch board 332, a more pressing force is applied to a higher area than the center on the switch board 332. Therefore, the switch board 332 is bent more in the upper portion. As a result, bending of the power generation element 90j is larger than bending of the power generation element 90i.

After that, when the user further presses the switch board 332 and the switch board 332 comes off from the power generation elements, free oscillation occurs so that the power generation element 90j generates a higher voltage and a more generated power amount than those of the power generation element 90i.

As a result, depending on a pressed position, a voltage and a generated power amount of each of the power generation element 90j and the power generation element 90i vary. Therefore, based on a value corresponding to a difference of at least one of a voltage and a generated power amount between the power generation elements, it is possible to determine the pressed position.

With the above structure, the operation position detection system is capable of detecting a pressed position.

More specifically, the operation position detection system according to the present embodiment includes a plurality of power generation switches. According to the present embodiment, respective operating parts included in the power generation switches are integrated as the single switch board 332.

Here, one end of the first connecting part in each of the power generation switches and one end of the switch board 332 are fixed to the fixed base 310C. It should be note that one end of the second connecting part in each of the power generation switches sticks to the switch board 332 via the permanent magnet 312 provided to the other end of the switch board 332.

The operation position detection system according to the present embodiment detects a position operated by the user on the switch board 332 serving as the operating part, based on a relationship between (a) the position operated by the user on the switch board 332 and (b) generated power amounts of the power generation switches.

The power generation switch according to the embodiment can be used for devices, such as remote controllers for television sets, each of which has a plurality of buttons.

Embodiment 11

If a power generation switch is used for a remote controller, the following embodiment, for example, is also conceived.

In general, regarding a remote controller or the like which has a plurality of buttons, a conductive rubber is attached to a bottom of each of the buttons. Under the buttons, there is an electrode plate on which an electrode line is printed. Here, on the electrode plate, the printed electrode line is disconnected at positions corresponding to the buttons, so that an electrode line becomes conductive at a position via the conductive rubber only when a button corresponding to the position is pressed.

Furthermore, a resistance value of the electrode line varies depending on a position where a button is pressed. Therefore, the remote controller can detect a position of a button pressed by the user.

FIG. 29 shows an embodiment in which the above-described structure and the power generation switch are combined. (a) in FIG. 29 is a side view of the power generation switch according to the present embodiment, and (b) in FIG. 29 shows a plan view of the power generation switch.

As shown in FIG. 29, the power generation switch according to the present embodiment includes a fixed base 310D, power generation elements 90$k$, 90$l$, 90$m$, and 90$n$, stiction plates 304B, permanent magnets 312 for switches, conductive structures 336, buttons 334, an electrode plate 338, a substrate 340, and an elastic structure 342. Each of the power generation elements 90$k$ to 90$n$ has the same structure as the power generation element according to any one of the above embodiments. It should be noted that FIG. 29 does not show an electrode line printed on the electrode plate 338.

The electrode plate 338 is attached, for example, on a top surface of the substrate 340 on which a microcomputer, an RF circuit, and the like are mounted. On the rear surface of the substrate 340, the elastic structure 342 is attached.

The elastic structure 342 is made of an elastic material such as a rubber. When the user presses the button 334 to lower the substrate 340, a restoring force occurs in the substrate 340 to restore the substrate 340 to the original shape.

On the top surface of the substrate 340, the stiction plates 304B each made of a magnetic material are provided. Furthermore, each of the power generation elements are fixed to the fixed base 310D so that a pair of the stiction plate 304B and the permanent magnet 312 face each other. In FIG. 29, the four stiction plates 304B are provided to respective four corners on the top surface of the substrate 340, and the four power generation elements 90$k$ to 90$n$ corresponding to the respective stiction plates 304B are fixed to the fixed base 310D. Normally, the permanent magnets 312 stick to the respective stiction plates 304B.

Here, it is assumed that the user presses one of the buttons "1" to "12" (one of the buttons 334). Thereby, one of the conductive structure 336 which is attached to the rear surface of the pressed button 334 is pressed to the electrode plate 338. As a result, an electrode line on the position of the electrode plate 338 which corresponds to the pressed button becomes conductive, thereby changing a resistance value of the electrode plate 338.

When the button 334 is further pressed, at least one of the stiction plates 304B comes off from the permanent magnet 312 to cause the power generation element to generate power by free oscillation. Resulting electrical energy drives the microcomputer or the like mounted on the substrate 340. The microcomputer or the like reads the resistance value of the electrode plate 338 and sends the readout result wirelessly.

Then, when the user reduces the force pressing the button 334, the substrate 340 returns to the original position by a restoring force of the elastic structure 342. As a result, the permanent magnet 312 sticks to the stiction plate 304B again.

With the above structure, the power generation switch is capable of detecting a button pressed by the user on a remote controller having a plurality of buttons, and capable of wirelessly transmitting the detection result by using power generated in the detection.

It should be noted that the power generation switch according to any one of the above embodiments may be used also in the following examples. Any one of the use examples does not need a battery and is therefore usable almost permanently.

Figure 30:
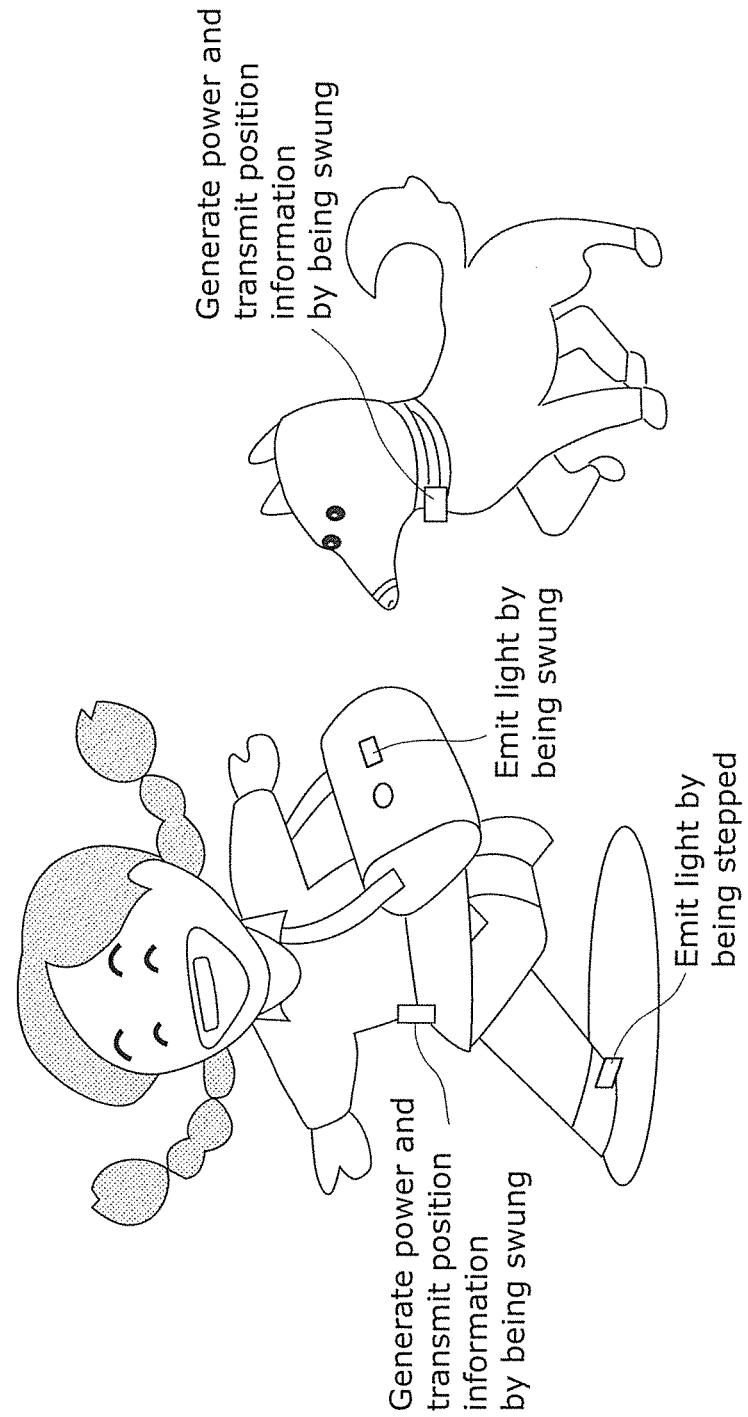
FIG. 30 is a schematic diagram showing a use example of the power generation switch according to any one of Embodiments 1 to 9.

FIG. 30 is a schematic diagram showing a use example of the power generation switch according to any one of Embodiments 1 to 9. For example, when the power generation switch is embedded in a sole of a shoe, the shoe is capable of emitting light from the surface of the shoe when a user steps. For another example, when the power generation switch is embedded in a bag, the bag is capable of emitting light when the bag swings.

It is also possible to provide a lighting device that emits light when the user presses the lighting device by a finger, and a warning board, an advertisement board, and the like each of which emits light when wind swings the board.

The above examples are conceived under the assumption that light is emitted to attract attention of people or to show advertisements. More specifically, belts, bags, shoes, bulletin boards, and the like which children and elderly people wear emit light to call attention of vehicle drivers.

Furthermore, a lump that emits light when a floor in front of a door is stepped, or a system that wirelessly sends information indicating the stepping is expected to be useful for security.

Furthermore, by charging generated power, it is possible to send position information obtained from a position sensor such as a Global Positioning System (GPS).

For example, it is conceived that a power generation switch, a position information transmission device, and/or the like are embedded in a belt or a shoe which a child or the like wears or a collar or the like which a pet wears. By using power generated by actions such as waist movements or stepping, it is possible to detect a position of the child or pet by appropriately receiving and sending position information.

Since a generated power amount is proportional to a volume of a power generation element, it is possible that a power generation element including a larger power generation element is operated by a large force such as waves or winds to generate power at a higher output.

It should be noted that the power generation switch may be coated or sealed to protect against rust. In order to prevent that an excess force is applies and damages the power generation element, the power generation switch may further include a protection device such as a mechanical stopper or a cover.

It should be noted that, in each of the above embodiments, it is desirable that a coil wound around a magnetostrictive rod is wound more at the free end closer to the connecting part, than at the center of the magnetostrictive rod. In other words, it is desirable that the center of the gravity of the coil is positioned closer to the free end than the center of the magnetostrictive rod.

It should be noted that the power generation element 90 shown in FIG. 2 includes the back yoke 15, but the field parts 14*a* and 14*b* can produce a bias magnetic field in the magnetostrictive rods 11*a* and 11*b*, respectively, without the back yoke 15. Therefore, the same effects as above can be offered without the back yoke 15. However, the provision of the back yoke 15 allows the field parts 14*a* and 14*b* to more efficiently produce a bias magnetic field in the magnetostrictive rods 11*a* and 11*b*.

It should be noted that in each of the above-described figures, corners and sides of each of the structural element are linearly shown. However, for the reasons in manufacturing, rounded corners and rounded sides are also possible in the present invention.

It should be note that at least a part of the functions in the power generation switches according to the above embodiments and their variations is combined.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention is applicable to power generation switches, and more particularly to, for example, a power generation switch that is driven by power generated by an inverse magnetostriction effect caused in a magnetostrictive element in the power generation switch.

The invention claimed is:

1. A power generation switch that is driven by power generated by an inverse magnetostriction effect caused in a magnetostrictive element, the power generation switch comprising:
   parallel beams at least one of which is a magnetostrictive rod made of a magnetostrictive material in a beam shape;
   a coil wound around the magnetostrictive rod;
   a first connecting part connecting, at respective first ends of the parallel beams, two beams included in the parallel beams to each other;
   a second connecting part connecting, at respective second ends of the parallel beams, the two beams included in the parallel beams to each other, the second ends being different from the first ends;
   a field part that produces magnetic flux to pass through the two beams in a same direction; and
   an operating part that is operated by a user,
   wherein the first connecting part is a fixed end that is not displaced,
   the second connecting part is a free end capable of free oscillation, and
   the operating part applies an external force to the second connecting part so as to cause free oscillation of the parallel beams, the free oscillation (i) causing a positive axial force in one of the two beams and (ii) causing a negative axial force in an other one of the two beams.

2. The power generation switch according to claim 1, wherein the second connecting part is longer than the first connecting part.

3. The power generation switch according to claim 1, wherein at least one of the first connecting part and the second connecting part has an end in a substantially U shape, and
   the end having the substantially U shape includes a rectangular column part that is pushed to be inserted between the two beams to connect the two beams to each other, the two beams being in contact with inside of the substantially U shape.

4. The power generation switch according to claim 1, wherein the second connecting part is bent in a substantially U shape.

5. The power generation switch according to claim 1, wherein the first connecting part, the second connecting part, and one of the two beams included in the parallel beams are integrated together.

6. The power generation switch according to claim 1, wherein one end of the first connecting part is fixed to an inner surface of an opening of a fixed base, and
   the operating part includes:
   a lid part covering the opening of the fixed base; and
   a plate part which is jointed with the lid part and in contact with the second connecting part in the opening of the fixed base,
   wherein, when the lid part is bent by an external force, the lid part applies the external force to the second connecting part via the plate part so that free oscillation of the parallel beams occurs.

7. An operation position detection system comprising
   a plurality of power generation switches including the power generation switch according to claim 1,
   wherein the operating parts in the respective power generation switches are integrated into a single switch board,
   one end of the first connecting part in each of the power generation switches and one end of the single switch board are fixed to a fixed base,
   one end of the second connecting part in each of the power generation switches sticks to the single switch board via a permanent magnet provided to an other end of the single switch board, and
   a position operated by the user on the operating part is detected based on a relationship between (a) the position and (b) respective power amounts generated by the power generation switches.

8. The power generation switch according to claim 1, wherein the external force is a force caused by one of a wind pressure and a water pressure.

9. The power generation switch according to claim 1, wherein the operation part has an end provided with a weight.

10. The power generation switch according to claim 8, wherein the operation part has an end provided with a flat plate.

11. The power generation switch according to claim 1, wherein the respective first ends of the parallel beams are fixed to the first connecting part, and
   the respective second ends of the parallel beams are fixed to the second connecting part.

12. The power generation switch according to claim 1, wherein the second connecting part is bent in a substantially L shape.

13. The operation position detection system according to claim 7,
wherein the plurality of the power generation switches include a first power generation switch and a second power generation switch,
the one end of the first connecting part in the first power generation switch is connected to the one end of the first connecting part in the second power generation switch, and
the first power generation switch and the second power generation switch alternately operate.

* * * * *